(12) United States Patent
Saitoh et al.

(10) Patent No.: US 9,755,055 B2
(45) Date of Patent: Sep. 5, 2017

(54) SEMICONDUCTOR DEVICE AND METHOD FOR MANUFACTURING THE SAME

(71) Applicant: Kabushiki Kaisha Toshiba, Tokyo (JP)

(72) Inventors: Masumi Saitoh, Kanagawa (JP);
Toshinori Numata, Kanagawa (JP);
Yukio Nakabayashi, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 128 days.

(21) Appl. No.: 14/568,227

(22) Filed: Dec. 12, 2014

(65) Prior Publication Data

US 2015/0097189 A1 Apr. 9, 2015

Related U.S. Application Data

(62) Division of application No. 13/082,103, filed on Apr. 7, 2011, now Pat. No. 8,932,915.

(30) Foreign Application Priority Data

Jun. 11, 2010 (JP) ................................ 2010-134460

(51) Int. Cl.
*H01L 29/66* (2006.01)
*B82Y 10/00* (2011.01)
(Continued)

(52) U.S. Cl.
CPC ........ *H01L 29/66765* (2013.01); *B82Y 10/00* (2013.01); *H01L 21/84* (2013.01); *H01L 27/0688* (2013.01); *H01L 27/11578* (2013.01); *H01L 27/11582* (2013.01); *H01L 27/1203* (2013.01); *H01L 29/04* (2013.01);
(Continued)

(58) Field of Classification Search
None
See application file for complete search history.

(56) References Cited

U.S. PATENT DOCUMENTS

2004/0219722 A1 11/2004 Pham et al.
2008/0171423 A1 7/2008 Leong et al.
2009/0242990 A1 10/2009 Saitoh et al.

FOREIGN PATENT DOCUMENTS

JP 2008-172234 7/2008
JP 2009-239167 10/2009

OTHER PUBLICATIONS

Ota et al., "Novel Locally Strained Channel Technique for High Performance 55nm CMOS," IEDM Technical Digest (2002), pp. 27-30.
(Continued)

*Primary Examiner* — Long Pham
(74) *Attorney, Agent, or Firm* — Finnegan, Henderson, Farabow, Garrett & Dunner, L.L.P.

(57) ABSTRACT

A semiconductor device manufacturing method of an embodiment includes the steps of: forming a first insulating layer on a semiconductor substrate; forming on the first insulating layer an amorphous or polycrystalline semiconductor layer having a narrow portion; forming on the semiconductor layer a second insulating layer having a thermal expansion coefficient larger than that of the semiconductor layer; performing thermal treatment; removing the second insulating layer; forming a gate insulating film on the side faces of the narrow portion; forming a gate electrode on the gate insulating film; and forming a source-drain region in the semiconductor layer.

11 Claims, 20 Drawing Sheets

(51) Int. Cl.
  *H01L 21/84* (2006.01)
  *H01L 27/06* (2006.01)
  *H01L 27/11578* (2017.01)
  *H01L 27/11582* (2017.01)
  *H01L 27/12* (2006.01)
  *H01L 29/04* (2006.01)
  *H01L 29/06* (2006.01)
  *H01L 29/775* (2006.01)
  *H01L 29/78* (2006.01)
  *H01L 29/792* (2006.01)
  *H01L 29/786* (2006.01)
  *H01L 21/8238* (2006.01)
  *H01L 27/092* (2006.01)

(52) U.S. Cl.
  CPC .... *H01L 29/0673* (2013.01); *H01L 29/66439* (2013.01); *H01L 29/66666* (2013.01); *H01L 29/66833* (2013.01); *H01L 29/775* (2013.01); *H01L 29/7827* (2013.01); *H01L 29/7843* (2013.01); *H01L 29/7847* (2013.01); *H01L 29/78669* (2013.01); *H01L 29/78678* (2013.01); *H01L 29/792* (2013.01); *H01L 21/823821* (2013.01); *H01L 21/845* (2013.01); *H01L 27/092* (2013.01); *H01L 27/1211* (2013.01)

(56) References Cited

OTHER PUBLICATIONS

Notification of Reason(s) for Refusal issued by the Japanese Patent Office on May 8, 2012, for Japanese Patent Application No. 2010-134460, and English-language translation thereof.

CROSS SECTION B-B

CROSS SECTION C-C

CROSS SECTION D-D

CROSS SECTION E-E

CROSS SECTION F-F

CROSS SECTION G-G

CROSS SECTION I-I

CROSS SECTION J-J

SEMICONDUCTOR DEVICE AND METHOD FOR MANUFACTURING THE SAME

CROSS-REFERENCE TO RELATED APPLICATION

This is a division of application Ser. No. 13/082,103, filed Apr. 7, 2011, which is incorporated herein by reference.

This application is based upon and claims the benefit of priority from Japanese Patent Application No. 2010-134460, filed on Jun. 11, 2010, the entire contents of which are incorporated herein by reference.

FIELD

Embodiments described herein relate generally to a semiconductor and a method for manufacturing the same.

BACKGROUND

As a structure for realizing an ultra-fine MISFET with a gate length of not longer than 30 nm, a Fin-type channel MISFET (FinFET) and a nanowire-type channel transistor (nanowire transistor) which have strong resistance to a short-channel effect have been expected. In the FinFET, for example, part of a rectangular parallelepiped semiconductor formed on a silicon substrate is taken as a channel region. On both sides of this channel region, a gate electrode is formed so as to sandwich the thin channel region. With the gate electrode structured to surround the channel region, the gate has strong domination to the channel region, and the FinFET realizes strong resistance to the short channel effect.

The nanowire transistor has a structure where the gate electrode is also provided on the top face of the rectangular parallelepiped semiconductor, and a height of the rectangular parallelepiped semiconductor is made smaller. In the nanowire transistor, the top face of the rectangular parallelepiped semiconductor also operates as the channel. A nanowire transistor with a rectangular parallelepiped semiconductor of a relatively large size is also referred to as a Tri-gate transistor.

In manufacturing the FinFET and the nanowire transistor, a SOI substrate is often used rather than a bulk substrate. There are two main reasons for this.

One reason is to be able to use a buried oxide film as a etching stopper on the formation of the rectangular parallelepiped semiconductor layer. The other reason is to be able to reliably suppress a leak current between a source and a drain at OFF-state due to the presence of the buried oxide film as an insulating film under the channel region.

However, the SOI substrate is more expensive than the bulk substrate, thereby inducing an increase in cost of the manufacturing process as a whole. There has thus been considered a nanowire transistor formed on the bulk substrate, with a channel region provided in a polycrystalline semiconductor layer.

It is understood that in the polycrystalline nanowire transistor formed on the bulk substrate, a crystal grain boundary is present in the channel region, thereby causing a problem of inferior characteristics and large variations in characteristics as compared with the nanowire transistor formed on the SOI substrate.

DETAILED DESCRIPTION

A semiconductor device manufacturing method of an embodiment has the steps of: forming an insulating layer on a semiconductor substrate; forming on the insulating layer an amorphous or polycrystalline semiconductor layer having a narrow portion; forming on the semiconductor layer an insulating layer having a thermal expansion coefficient larger than that of the semiconductor layer; performing thermal treatment; removing the insulating layer; forming a gate insulating film on the side faces of the narrow portion; forming a gate electrode on the gate insulating film; and forming a source-drain region in the semiconductor layer.

Hereinafter, embodiments are described with reference to the drawings.

It should be noted that in the specification, a gate length direction means a direction in which an electron or a hole as a carrier flows in a channel region of a transistor. Further, a gate length means a length of the gate electrode in the gate length direction.

First Embodiment

A semiconductor device manufacturing method of the present embodiment includes the steps of: forming an insulating layer on a semiconductor substrate; forming on the insulating layer an amorphous or polycrystalline semiconductor layer having a narrow portion; forming on the semiconductor layer an insulating layer having a thermal expansion coefficient larger than that of the semiconductor layer; performing thermal treatment; removing the insulating layer; forming a gate insulating film on the side faces of the narrow portion; forming a gate electrode on the gate insulating film; and forming a source-drain region in the semiconductor layer.

According to the semiconductor device manufacturing method of the present embodiment, the semiconductor layer to become the channel region is crystallized under stress, thereby applying tensile strain in the gate length direction to the channel region. For this reason, in the case of the semiconductor device being an n-type transistor, improvement in on-current, reduction in off-current and suppression of variations in transistor characteristics are realized. Further, in the case of the semiconductor device being a p-type transistor, reduction in off-current and suppression of variations in transistor characteristics are realized.

Figure 1:
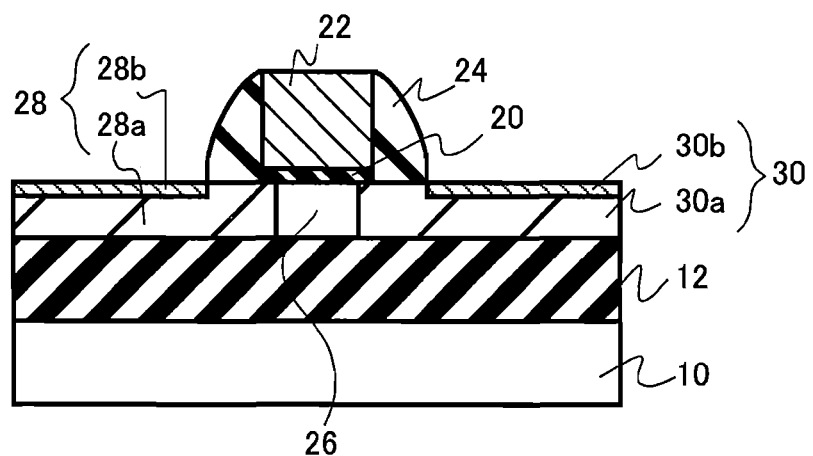
FIG. 1 is a sectional schematic view of a semiconductor device of a first embodiment.
Figure 2:
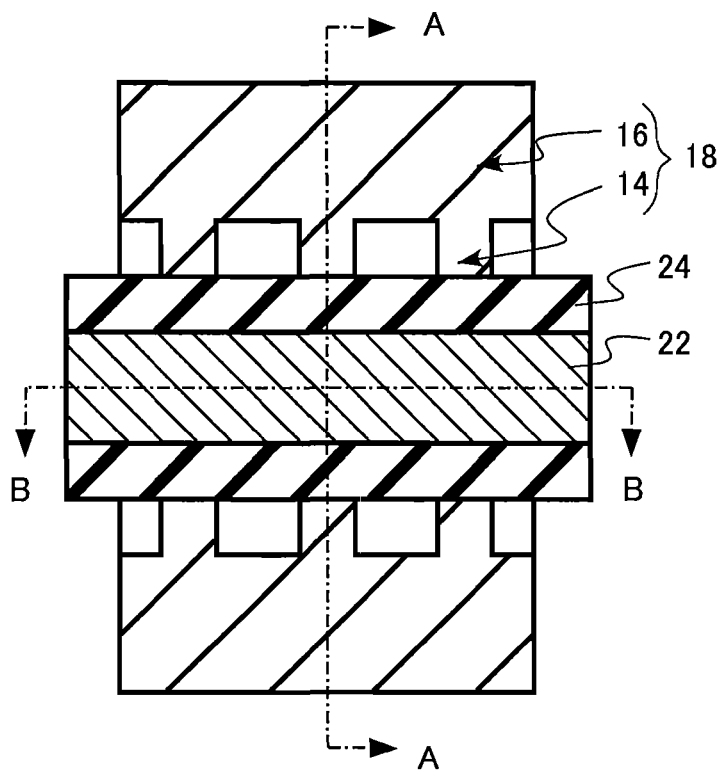
FIG. 2 is a top schematic view of the semiconductor device of the first embodiment.
Figure 3:
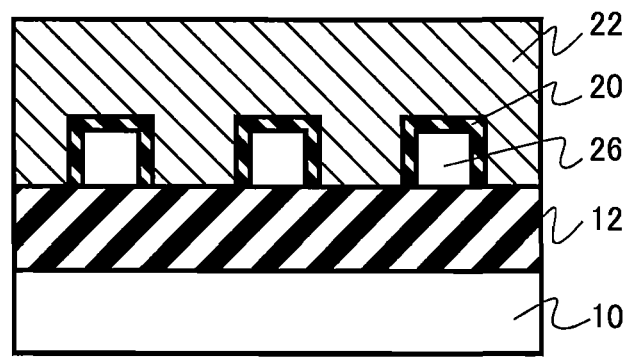
FIG. 3 is a sectional schematic view of the semiconductor device of the first embodiment.

FIG. 2 is a top schematic view of the semiconductor device manufactured by the semiconductor device manufacturing method of the present embodiment. FIG. 1 is a sectional schematic view of a plane A-A (gate length direction) in FIG. 2. FIG. 3 is a sectional schematic view of a plane B-B (gate width direction) in FIG. 2.

The semiconductor device shown in FIGS. 1 to 3 is a polycrystalline silicon nanowire transistor with a semiconductor layer being polycrystalline silicon. This polycrystalline silicon nanowire transistor includes: a silicon substrate 10; an oxide film 12 as an insulating layer formed on this silicon substrate 10; a polycrystalline silicon layer 18, formed on this oxide layer 12 and having one or more narrow portions (silicon nanowires) 14 and wide portions 16; a gate insulating film 20 formed on the side faces and the top face of the silicon nanowire 14; a gate electrode 22 formed on this gate insulating film 20; gate side walls 24 formed on both sides of this gate electrode 22; a source region 28 and a drain region 30 which are formed in the silicon nanowire 14 so as to sandwich a channel region 26. A source region 28 and a drain region 30 are formed of impurity diffusion layers 28a and 30a and metal silicide films 28b and 30b.

The oxide film 12 is, for example, a silicon oxide film. Further, the gate side wall 24 is, for example, a silicon nitride film.

In the silicon nanowire 14, a region formed with the gate electrode 22 on the top thereof operates as the channel region 26. The channel region 26 has a plate-like structure (nanowire structure), for example with a width (length in the gate width direction) of the order of 3 to 25 nm and a height of the order of 3 to 40 nm.

The polycrystalline silicon nanowire 14 has tensile strain in the gate length direction (direction A-A) in the channel region. Herein, having tensile strain in the gate length direction means a crystal lattice spacing in the gate length direction being larger than a crystal lattice spacing in a state without strain. In other words, a crystal lattice spacing in the gate length direction is larger than a crystal lattice spacing in a non-distorted state. The crystal lattice spacing can be evaluated by means of Raman spectrometry.

Herein, a "strain amount $\in$" is defined as $\in=(a-a_0)/a_0$, where a lattice spacing of the crystal in the state without strain is "$a_0$", and a lattice spacing of the crystal after being added with strain is "a". In the case of silicon, $a_0=5.43$ angstroms.

In the case of the present embodiment, with the tensile strain present in the gate length direction, the crystal lattice spacing in the gate length direction is larger than the crystal lattice spacing in the state without strain. Therefore, the "strain amount $\in$" takes a positive value.

In the case of the polycrystalline silicon, a crystal orientation of each crystal grain is not constant, and therefore, when a crystal lattice spacing is to be calculated, a component of the lattice spacing in the gate length direction may be extracted and compared with that of the lattice spacing in the same direction in the state without strain.

Further, a grain size of the silicon nanowire 14 is larger than a grain size of a non-nanowire region, namely the wide portion. The grain size can be evaluated, for example, by TEM. The large grain size of the narrow portion is considered to contribute to reduction in off-current and suppression of variations in transistor characteristics as described later.

Figure 4:
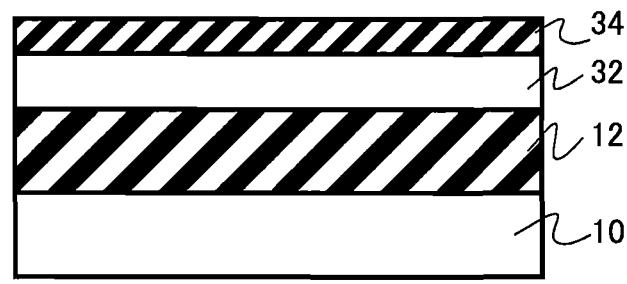
FIG. 4 is a sectional schematic view showing a semiconductor device manufacturing method of the first embodiment.
Figure 5:
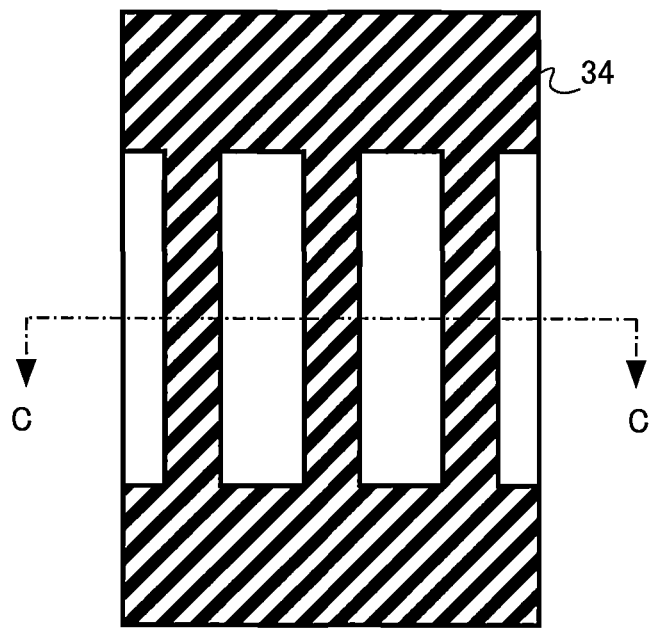
FIG. 5 is a top schematic view showing the semiconductor device manufacturing method of the first embodiment.
Figure 6:
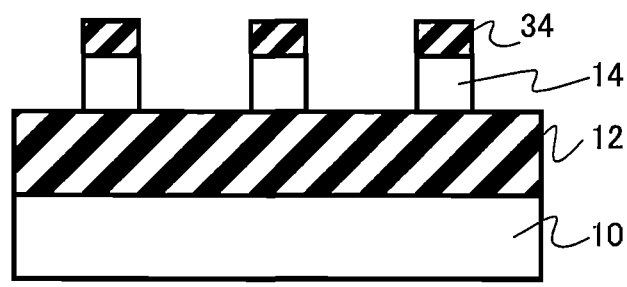
FIG. 6 is a sectional schematic view showing the semiconductor device manufacturing method of the first embodiment.
Figure 7:
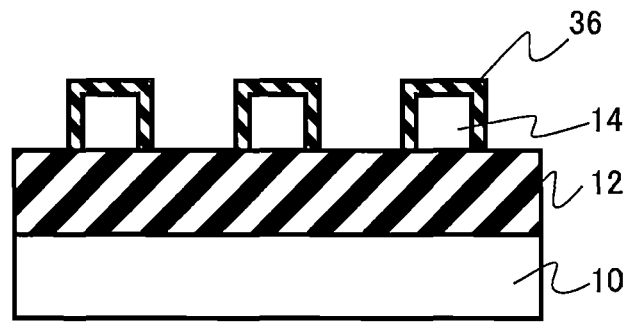
FIG. 7 is a sectional schematic view showing the semiconductor device manufacturing method of the first embodiment.
Figure 8:
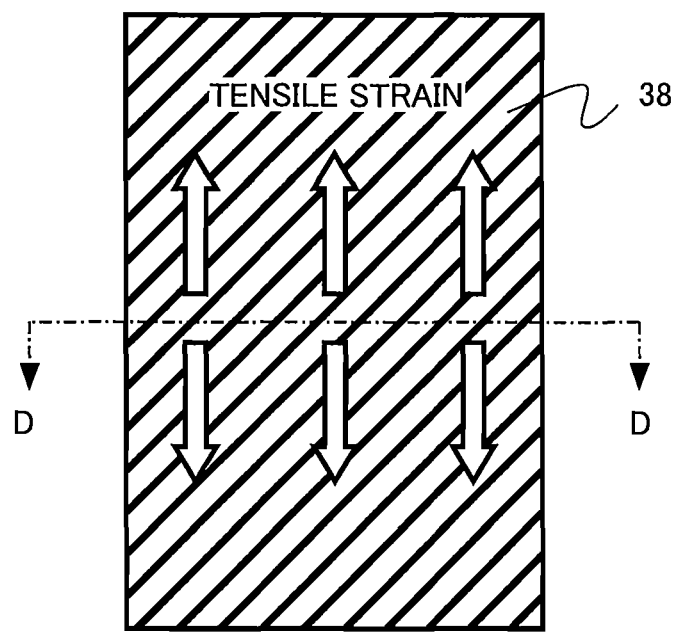
FIG. 8 is a top schematic view showing the semiconductor device manufacturing method of the first embodiment.

Hereinafter, a semiconductor device manufacturing method of the present embodiment is described with reference to the drawings. FIGS. 4 to 9 are sectional schematic views showing the manufacturing method of the present embodiment. FIGS. 4, 6 and 7 are sectional schematic views corresponding to a plane B-B in FIG. 1. FIGS. 5 and 8 are top schematic views.

First, as shown in the sectional schematic view of FIG. 4, a structure made up of an oxide film (first insulating layer) 12, an amorphous silicon layer 32 and a hard mask layer 34 is formed on a bulk silicon substrate 10. The amorphous silicon layer 32 has a thickness of the order of 3 to 40 nm, for example. It should be noted that the semiconductor formed on the oxide film 12 is desirably an amorphous silicon layer from the viewpoint of increasing an amount of strain later induced in the semiconductor layer. However, a polycrystalline silicon layer may be formed in place of the amorphous silicon layer.

Subsequently, as shown in the top schematic view of FIG. 5, and FIG. 6 as a sectional schematic view of a plane C-C in FIG. 5, after patterning of the hard mask layer 34, the amorphous silicon layer 32 is etched with this hard mask layer 34 used as a mask, to partially narrow (form into plate shape) the amorphous silicon layer 32 in the gate width direction. That is, the amorphous silicon layer 32 having a narrow portion is formed. The amorphous silicon layer formed into plate shape (silicon nanowire or narrow portion) has a width of the order of 3 to 25 nm, for example.

Subsequently, as shown in the sectional schematic view in the gate width direction of FIG. 7, after removal of the hard mask layer 34, a protective insulating film 36 is formed on the side faces and the top face of the amorphous silicon nanowire 14. The protective insulating film 36 is, for example, a silicon oxide film. As a method for forming the protective insulating film 36, thermal oxidation, CVD or the like can be applied. The protective insulating film has a thickness of the order of 1 to 10 nm, for example.

The protective insulating film 36 is useful from the viewpoint of alleviating process damage on the amorphous silicon layer 32 and the like at the time of formation and removal of a strain inducing insulating film which are performed later. However, the formation may be omitted for the sake of simplicity of the manufacturing process.

Figure 9:
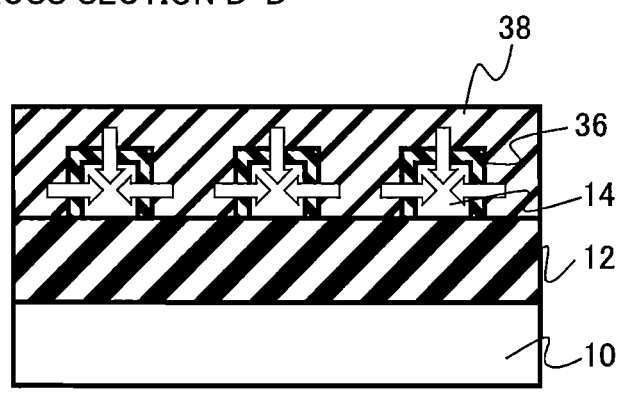
FIG. 9 is a sectional schematic view showing the semiconductor device manufacturing method of the first embodiment.

Then, as shown in the top schematic view of FIG. 8 and FIG. 9 as a sectional schematic view of a plane D-D (gate width direction) in FIG. 8, a strain inducing insulating film (second insulating layer) 38, having a larger thermal expansion coefficient than that of the amorphous silicon layer 32, is formed on the protective insulating film 36. A strain inducing insulating film 38 is a silicon nitride film, for example. It is desirable to form the strain inducing insulating film 38 so as to fill a space between the narrow portions of the amorphous silicon layer 32 as shown in FIG. 9 from the viewpoint of effectively applying stress to the narrow portions.

The silicon nitride film has a thickness of the order of 10 to 100 nm. The method for forming the silicon nitride film may be LPCVD or PCVD (plasma CVD). In the LPCVD, a film is formed at a high temperature of not lower than 600° C., and it is thus desirable from the viewpoint of being able to obtain a film with a relatively large thermal expansion coefficient. Meanwhile, in the PCVD, a film is formed at a relatively low temperature, and hence in the case of a producing the device on a support substrate with a low melting point, such as a glass substrate or in the case of being concerned about fluctuations in device characteristics and the like due to a high-temperature process, the PCVD is desirably used from the viewpoint of suppressing the fluctuations and the like. In the case of the PCVD, plasma damage and hydrogen damage are concerned, but the damage can be reduced by optimization of film formation conditions or irradiation with ultraviolet rays after film formation.

It is to be noted that the strain inducing insulating film 38 is not restricted to the silicon nitride film, but another material with a larger thermal expansion coefficient than that of silicon may be used.

Subsequently, thermal treatment is performed to crystallize the amorphous silicon layer 32. In the case of forming the polycrystalline silicon in place of the amorphous silicon layer 32 at the stage of FIG. 4, the crystal grain size increases due to this thermal treatment. Thermal treatment conditions may be, for example, a temperature of 500 to 1100° C., a nitrogen atmosphere, and the time of several ms to several tens of hours.

At the time of this thermal treatment, since the silicon nitride film surrounding the amorphous silicon layer 32 expands due to heat, and the amorphous silicon layer 32 on the inside is thus applied with pressing force within the cross section in the width direction of the nanowire 14, as shown in white arrows of FIG. 9. As a consequence, tensile strain is induced in the length direction (gate length direction) in the amorphous silicon nanowire 14.

Since the crystallization occurs with this tensile strain in the induced state, the tensile strain naturally remains in the nanowire length direction in each crystal grain after the crystallization. That is, the crystal lattice spacing in the gate length direction of the crystal of the silicon nanowire 14 as the narrow portion becomes larger than the crystal lattice spacing in the state without strain.

Then, the silicon nitride film as the strain inducing insulating film 38 is removed. For this removal treatment, a process may be used which is capable of selectively removing the silicon nitride film with respect to the protective insulating film 36 underneath, and in the case of the protective insulating film 36 being a silicon oxide film, for example, wet etching by phosphoric acid, reactive ion etching, or the like can be applied. It should be noted that, even after removal of the silicon nitride film, the tensile strain induced at the time of crystallization of the polycrystalline silicon nanowire remains in the nanowire crystal grains.

Subsequently, the protective insulating film 36 is removed, to expose the side faces and the top face of the silicon nanowire 14 as the narrow portion of the polycrystalline silicon layer. For this removal treatment, for example, wet etching by hydrofluoric acid is used.

Then, the gate insulating film 20 is formed on the side faces and the top face of the polycrystalline silicon nanowire 14. Herein, as the gate insulating film 20, for example, a silicon oxide film, a silicon oxynitride film, a high-dielectric-constant film, or a stacked film of the silicon oxide film and the high-dielectric-constant film are can be applied.

Subsequently, the gate electrode 22 is formed on the gate insulating film 20, and a hard mask layer for gate-electrode patterning is further formed on the gate electrode 22, and pattern this hard mask layer. Herein, as the gate electrode 22, for example, poly Si, metal silicide, TiN, W, TaC or a stacked film of poli-Si and a metal may be applied. Thereafter, with this hard mask layer used as a mask, the gate electrode 22 and the gate insulating film 20 are patterned, and the gate electrode 22 and the gate insulating film 20 are left only in part of the top of the narrow portion as the polycrystalline silicon nanowire 14.

Then, the gate side walls 24 are formed on both sides of gate electrode 22. Herein, as a material for the gate side wall 24, for example, an oxide film, a nitride film, or a stacked film of the oxide film and the nitride film can be used. The gate side wall 24 desirably has a thickness of the order of 10 to 20 nm from the viewpoint of reducing parasitic resistance and suppressing an increase in parasitic capacity.

Subsequently, ion implantation is performed, to form the impurity diffusion layers 28a and 30a of the source region 28 and the drain region 30 on both sides of the gate side wall 24. In addition, a silicon layer with a thickness of several tens of nm may be epitaxially grown on the source-drain region before or after the ion implantation to reduce parasitic resistance at source-drain region.

Further, the metal silicide films 28b and 30b are formed on the impurity diffusion layers 28a and 30a of the source region 28 and the drain region 30. For the metal silicide films 28b and 30b, for example, nickel silicide, nickel platinum silicide, or cobalt silicide is formed. Although the figure shows the metal silicide films 28b and 30b formed by partial silicidation of the impurity diffusion layers 28a and 30a, those films may be obtained by full silicidation of the impurity diffusion layers 28a and 30a.

Afterward, a conventional transistor manufacturing process is performed to complete the polycrystalline silicon nanowire transistor shown in FIGS. 1 to 3.

Figure 10:
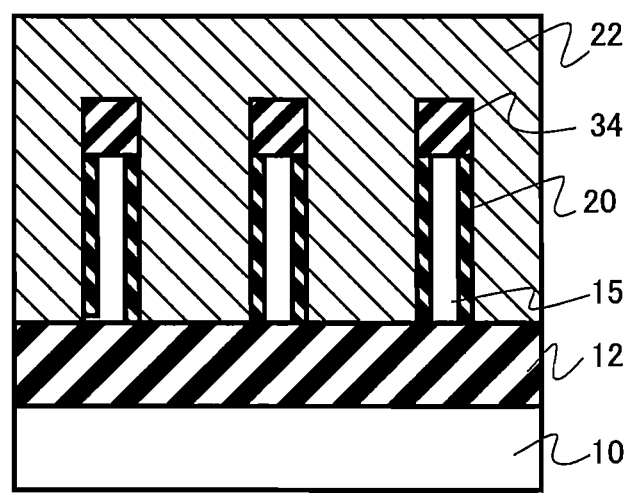
FIG. 10 is a sectional schematic view of a modified example of the first embodiment.

FIG. 10 is a sectional schematic view of a semiconductor device in a modified example of the present embodiment. In the foregoing description, a tri-gate structure was assumed where the gate insulating film 20 is formed on the side faces and the top face of the polycrystalline silicon nanowire 14. However, as shown in FIG. 10, a FinFET structure may be adopted where the gate insulating film 20 is formed only on the side faces of a semiconductor layer 15 corresponding to the polycrystalline silicon nanowire 14. In this case, the manufacturing method is to leave the hard mask layer 34 on the top of the polycrystalline semiconductor layer 15. The polycrystalline semiconductor layer 15 has a width of the order of 3 to 25 nm, for example. Further, the polycrystalline semiconductor layer 15 has a height of the order of 3 to 100 nm, for example.

Further, a gate-all-around structure may be adopted where the gate insulating film is formed not only on the top side faces of the polycrystalline silicon nanowire, but also on the under face thereof. In this case, the manufacturing method is to remove an insulating film such as an oxide film in the lower portion of the polycrystalline silicon by hydrofluoric acid treatment before formation of the gate insulating film.

According to the manufacturing method of the present embodiment, tensile strain in the gate length direction is induced in the channel region of the polycrystalline silicon nanowire, so that in the case of the n-type nanowire transistor, the mobility and the on-current can be significantly improved.

Hereinafter described are experiments conducted for evaluating improvement in performance of the nanowire transistor according to the present manufacturing method. Using the foregoing manufacturing method, a polycrystalline silicon nanowire transistor with a nanowire width of about 21 nm and a nanowire height (polycrystalline silicon layer thickness) of about 23 nm was produced. An oxide film formed on a bulk silicon substrate had a thickness of 100 nm, a strain inducing silicon nitride film had a thickness of 25 nm, and thermal treatment for crystallization of amorphous silicon nanowire was performed by spike RTA in a nitrogen atmosphere. A sample formed with the strain inducing silicon nitride film before crystallization thermal treatment and a sample not formed with the strain inducing silicon nitride film were prepared, and influences on electric characteristics of the transistor due to the presence of the strain inducing silicon nitride film were evaluated.

Figure 11A:
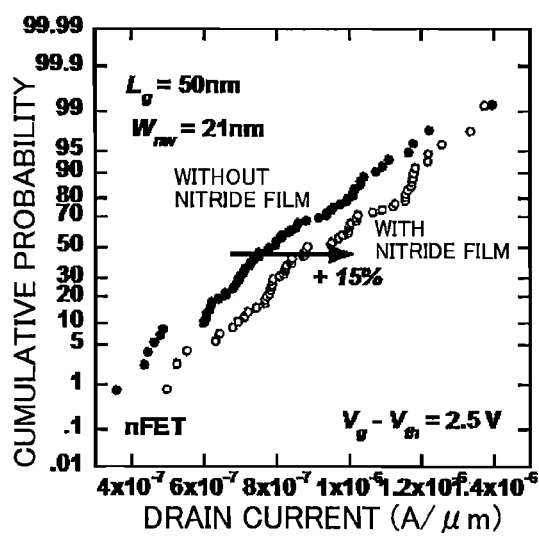
FIGS. 11A and 11B are diagrams showing measurement results of a drain current in the first embodiment.
Figure 11B:
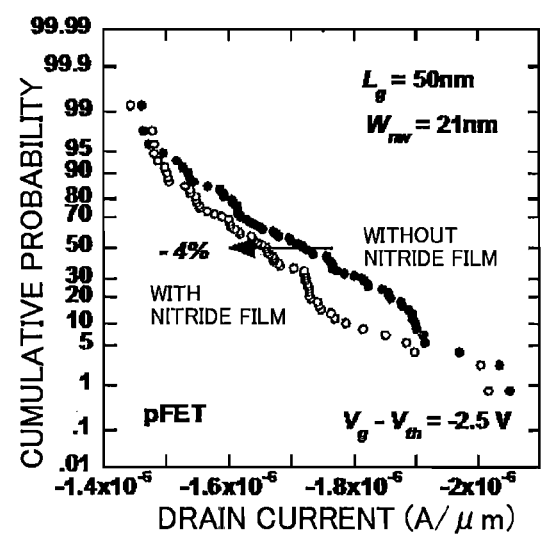

FIGS. 11A and 11B are diagrams showing results of measurement of changes in cumulative frequency distribution of a drain current of the nanowire transistor due to the presence or absence of the strain inducing silicon nitride film. FIG. 11A is a diagram on an n-type nanowire transistor, FIG. 11B is a diagram on a p-type nanowire transistor.

The measured device has a gate length of 50 nm and a nanowire width of 21 nm. A drain voltage was set to 10 mV, and the drain current was measured when a difference between a gate voltage and a threshold voltage was 2.5 V. Data on 67 devices manufactured on a 300-mm wafer are shown. Performing the crystallization thermal treatment with the silicon nitride film leads to an increase in drain current of the n-type transistor by about 15% on average. On the other hand, a current of the p-type transistor decreases by about 4%.

The current increase in the n-type transistor and the current decrease in the p-type transistor are results indicating that tensile strain in the gate length direction has been induced in the polycrystalline silicon nanowire.

In order to improve performance of the transistor, it is of importance not only to increase the drain on-current, but also to decrease the drain off-current. In order to suppress the off-current while holding the on-current high, it is of importance to steepen the rise of the drain current at the time of application of the gate voltage, and it is an S-factor (sub-threshold factor) that is an index indicating the steepness of the rise of the current. The smaller the S-factor, the steeper the rise, thereby allowing suppression of the off-current.

Figure 12A:
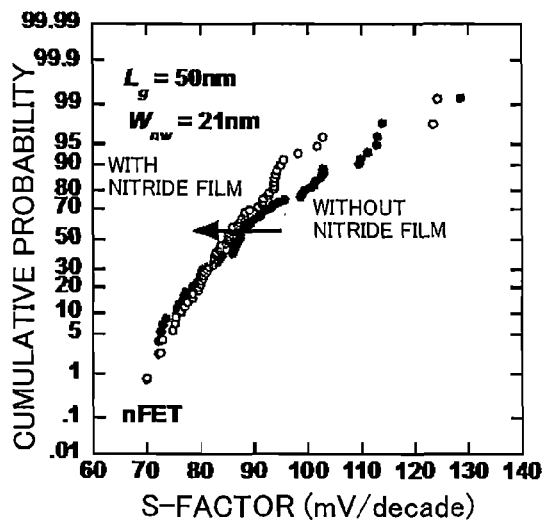
FIGS. 12A and 12B are diagrams showing measurement results of an S-factor in the first embodiment.
Figure 12B:
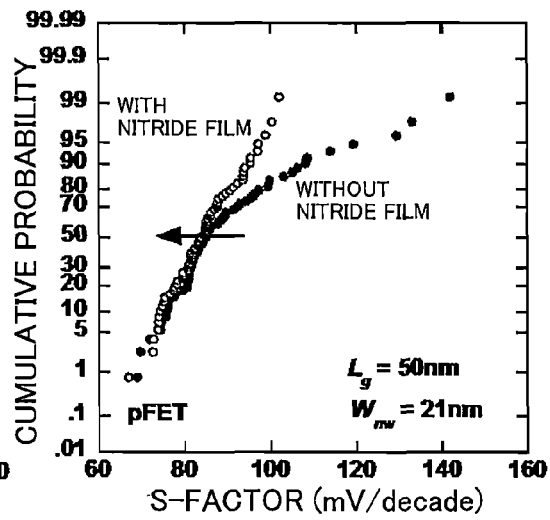

FIGS. 12A and 12B are diagrams showing results of measurement of changes in cumulative frequency distribution of an S-factor of the nanowire transistor due to the presence or absence of the strain inducing silicon nitride film. FIG. 12A is a diagram showing the n-type nanowire transistor. FIG. 12B is a diagram showing the p-type nanowire transistor. Performing the crystallization thermal treatment with the silicon nitride film leads to a steep distribution of the S-factor both in the n-type transistor and the p-type transistor. And a number of the devices with large S-factors, namely devices with large off-currents, decreases.

It is generally considered that the S-factor of the polycrystalline silicon transistor increases due to charge capture in a trap present in a crystal grain boundary. Hence the decrease in S-factor due to the crystallization thermal treatment with the silicon nitride film indicates a decrease in number of crystal grain boundaries themselves, namely an increase in size of the crystal grain (grain size). The decrease in S-factor, as well as the decrease in off-current as a result of the decrease in S-factor, is another major advantage along with the improvement in mobility according to the present manufacturing method. Further, the distribution of the S-factor becoming steep means that the variations in characteristics among the devices decrease. That is, according to the present manufacturing method, it is possible to suppress the variations in device characteristics.

Figure 13:
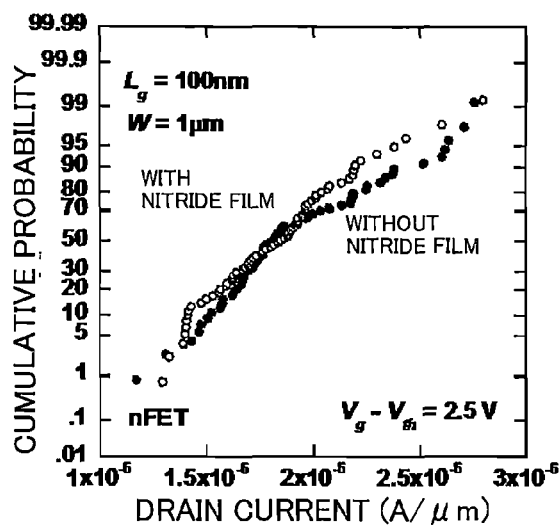
FIG. 13 is a diagram showing a measurement result of a drain current in the first embodiment.

FIG. 13 is a diagram showing a result of measurement of a change in cumulative frequency distribution of a drain current due to the presence or absence of the strain inducing silicon nitride film in an n-type polycrystalline silicon transistor with a large channel width (channel width of 1 μm) which was formed on the same substrate through the same process as the nanowire transistor.

The change in current due to the crystallization thermal treatment with the silicon nitride film is small as compared with the case of the nanowire transistor, and no particular degradation is seen. It is found therefrom that an amount of strain induced by the present manufacturing method is larger in a nanowire channel with a smaller width than in a channel with a larger width. That is, the structure of the silicon nitride film surrounding the narrow portion is considered to be important in increasing a strain inducing effect.

In other words, the manufacturing method of the present embodiment has no adverse effect on characteristics of a transistor with a wide channel width. Hence there is an advantage that, even when a transistor with a smaller width and a transistor with a larger width are both formed on the same substrate, altering the process with respect to each transistor is unnecessary.

As described above, according to the present manufacturing method, in the case of the n-type transistor, improvement in on-current, reduction in off-current and suppression of variations in transistor characteristics are realized. Further, in the case of the p-type transistor, reduction in off-current and suppression of variations in transistor characteristics are realized. Applying the bulk substrate in the present manufacturing method can significantly reduce cost as compared with a monocrystal silicon nanowire transistor which is manufactured applying the SOI substrate.

Second Embodiment

The semiconductor device manufacturing method of the present embodiment is to perform, in the manufacturing method of the first embodiment, crystallization thermal treatment on the amorphous silicon layer in a state where the strain inducing insulating film as the silicon nitride film that surrounds the amorphous silicon nanowire is formed only in the n-type transistor region, and the strain inducing insulating film of the silicon nitride film that surrounds the amorphous silicon nanowire is removed in the p-type transistor region. A description of contents overlapped with those of the first embodiment is not repeated here.

Figure 14:
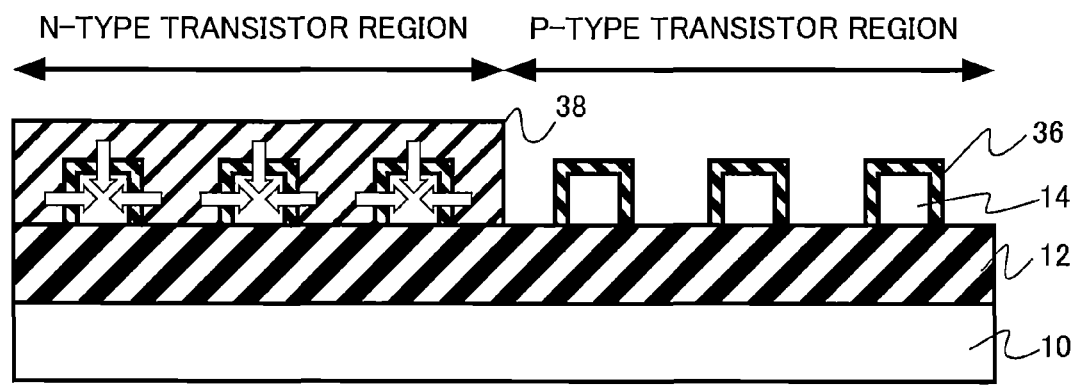
FIG. 14 is a sectional schematic view showing a semiconductor device manufacturing method of a second embodiment.

FIG. 14 shows a sectional schematic view in the gate width direction for explaining the semiconductor device manufacturing method of the present embodiment. The strain inducing insulating film 38 which is the silicon nitride film is formed on the protective insulating film 36 on the silicon nanowire 14, and the silicon nitride film in the p-type transistor region is then removed. This removal step is performed by applying hot phosphate treatment or reactive ion etching on the p-type transistor region with the n-type transistor region being covered by a hard mask or resist.

According to the present manufacturing method, as in the nanowire transistor manufactured by the manufacturing method of the first embodiment, the tensile strain in the gate length direction is induced in the polycrystalline silicon nanowire channel of the n-type transistor, so that the mobility and the on-current of the n-type nanowire transistor can be significantly improved.

Meanwhile, in the p-type nanowire transistor, the tensile strain in the gate length direction is not induced in the polycrystalline silicon nanowire channel, so that the mobility and the on-current do not degrade. It is therefore possible to improve the entire performance of the CMOS circuit formed of both the n-type transistor and the p-type transistor.

Further, according to the present manufacturing method, as in the nanowire transistor manufactured by the manufacturing method of the first embodiment, crystal grain growth occurs in the polycrystalline silicon nanowire channel, and the S-factor of the n-type nanowire transistor thus decreases, so that the off-current can be decreased and variations in characteristics among the devices can be suppressed.

With the use of the bulk substrate in the present manufacturing method, the manufacturing cost can be significantly reduced as compared with the monocrystalline silicon nanowire transistor manufactured using the SOI substrate.

Third Embodiment

A semiconductor device manufacturing method of the present embodiment is the same as that of the first embodiment except that a planer-type field-effect transistor is formed in a layer under the polycrystalline silicon nanowire transistor. Therefore, a description of contents overlapped with those of the first embodiment is not repeated here.

Figure 15:
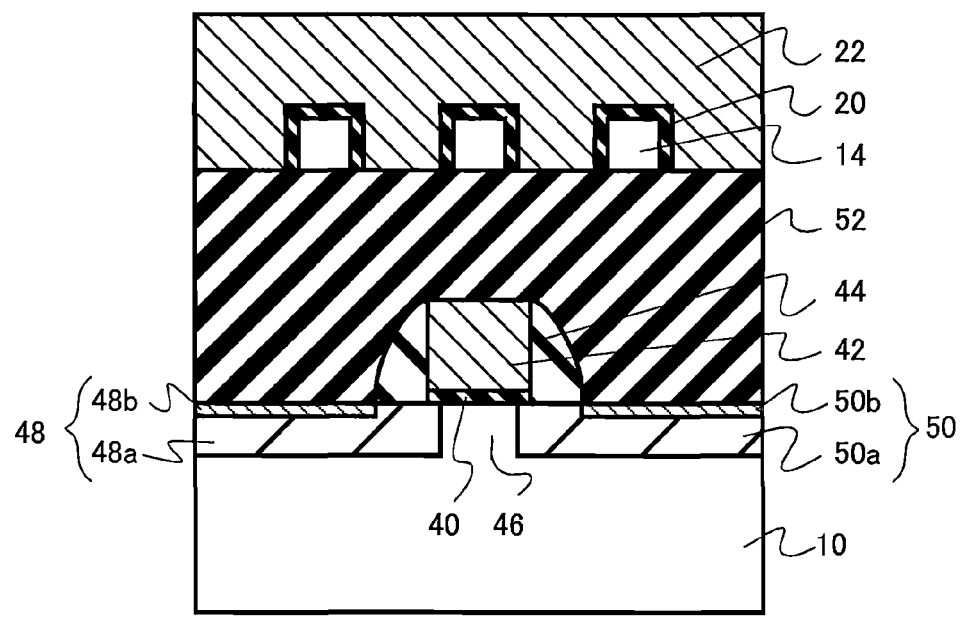
FIG. 15 is a sectional schematic view of a semiconductor device of a third embodiment.

FIG. 15 is a sectional schematic view in the gate width direction of a semiconductor device manufactured by the semiconductor device manufacturing method of the present embodiment. The planer-type field-effect transistor is formed on the silicon substrate 10.

This planer-type field-effect transistor is made up of a gate insulating film 40 on the silicon substrate 10, a gate electrode 42 formed on this gate insulating film 40, gate side walls 44 formed on both sides of this gate electrode 42, a source region 48 and a drain region 50 which are formed so as to sandwich a channel region 46. The source region 48 and the drain region 50 are made up of impurity diffusion layers 48a and 50a and metal silicide films 48b and 50b.

On the planer-type field-effect transistor, for example, an interlayer insulating film 52 which is a silicon oxide film is formed, and on the top face thereof, a polycrystalline silicon nanowire transistor is formed. This polycrystalline silicon nanowire transistor is formed of the gate insulating film 20 formed on the side faces and the top face of the silicon nanowire 14 formed on the interlayer insulating film 52, the gate electrode 22 formed on this gate insulating film 20, gate side walls (not shown) formed on both sides of this gate electrode 22, and a source-drain region (not shown) formed in the silicon nanowire so as to sandwich the channel region.

According to the present embodiment, it is possible to form a polycrystalline silicon nanowire transistor with excellent characteristics in the layer above the planer-type field-effect transistor formed on the bulk silicon substrate. It is therefore possible to form a high-performance and high-density semiconductor device through effective use of the region immediately over the planer-type field-effect transistor.

Although the description was herein made taking as an example the case of forming the planer-type field-effect transistor in the layer under the polycrystalline silicon nanowire transistor, this under-lying transistor is not restricted to the planer-type field-effect transistor, but may be other semiconductor devices such as a FinFET formed on the bulk silicon substrate.

Further, for example, in the case of forming an SRAM memory cell, n-type planer-type field-effect transistor may be formed in the lower layer, and the p-type polycrystalline silicon nanowire transistor may be formed in the upper layer. Moreover, it is also possible, for example, to form a transistor of a logic device in the lower layer, and form a cell transistor of a memory device, such as a DRAM transfer transistor, in the upper layer.

Fourth Embodiment

A semiconductor device manufacturing method of the present embodiment has the steps of: forming a first insulating layer on a semiconductor substrate; forming an amorphous or polycrystalline first semiconductor layer on the first insulating layer; forming a second insulating layer on the first semiconductor layer; forming an amorphous or polycrystalline second semiconductor layer on the second insulating layer; patterning the second semiconductor layer, the second insulating layer and the first semiconductor layer, to form narrow portions in the first and second semiconductor layers; forming on the first and second semiconductor layers a third insulating layer having a thermal expansion coefficient larger than those of the first and second semiconductor layers; performing thermal treatment; removing the third insulating layer; forming a gate insulating film on the side faces of the narrow portion; forming a gate electrode on the gate insulating film; and forming a source-drain region in the first and second semiconductor layers.

The semiconductor device manufacturing method of the present embodiment is the same as that of the first embodiment except that two layers of the silicon nanowire transistors are stacked. Therefore, a description of contents overlapped with those of the first embodiment is not repeated here.

Figure 16:
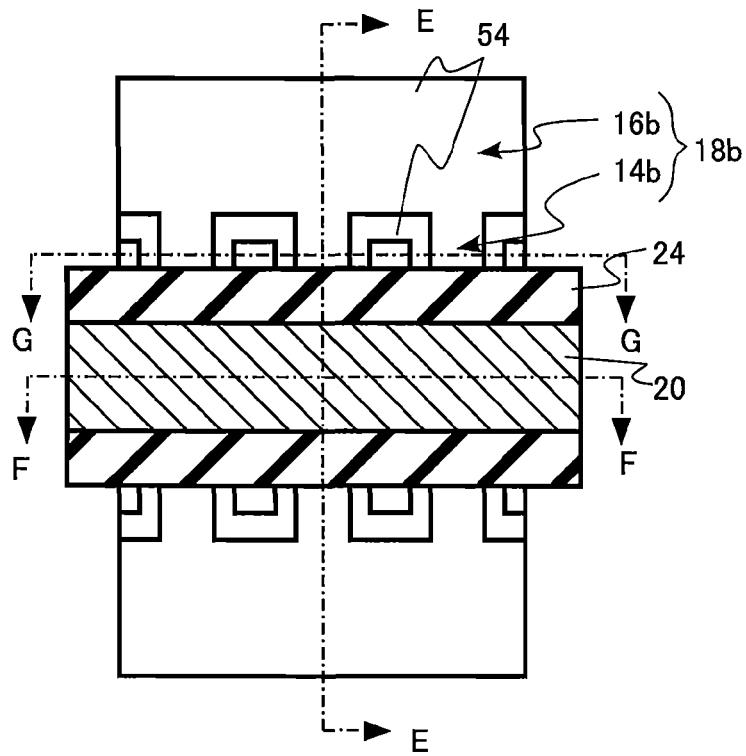
FIG. 16 is a top schematic view of a semiconductor device of a fourth embodiment.
Figure 17:
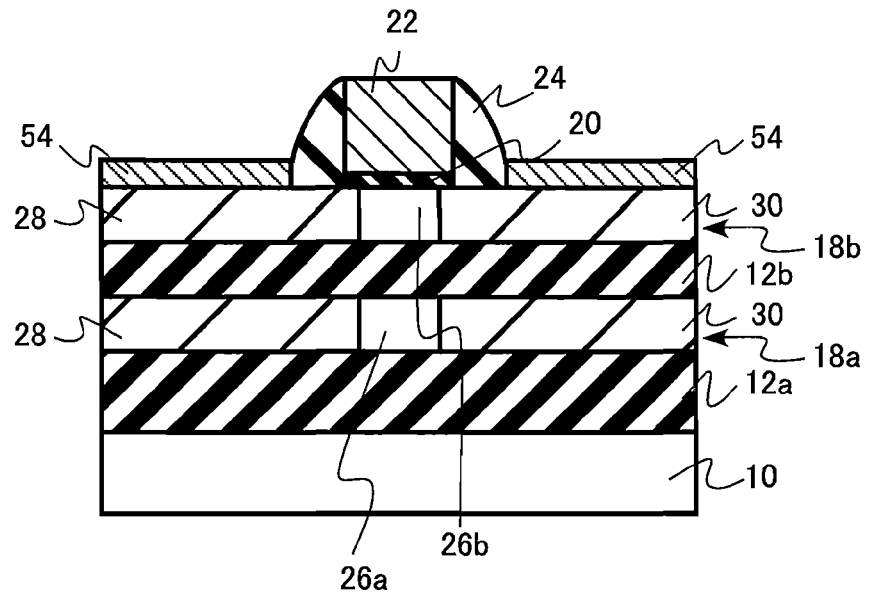
FIG. 17 is a sectional schematic view of the semiconductor device of the fourth embodiment.
Figure 18:
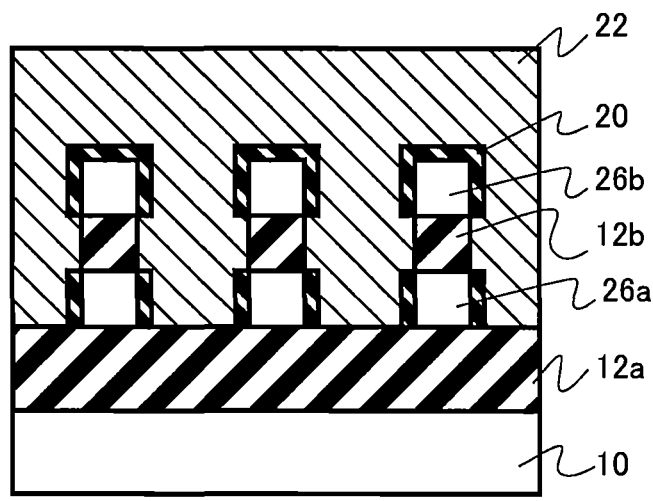
FIG. 18 is a sectional schematic view of the semiconductor device of the fourth embodiment.
Figure 19:
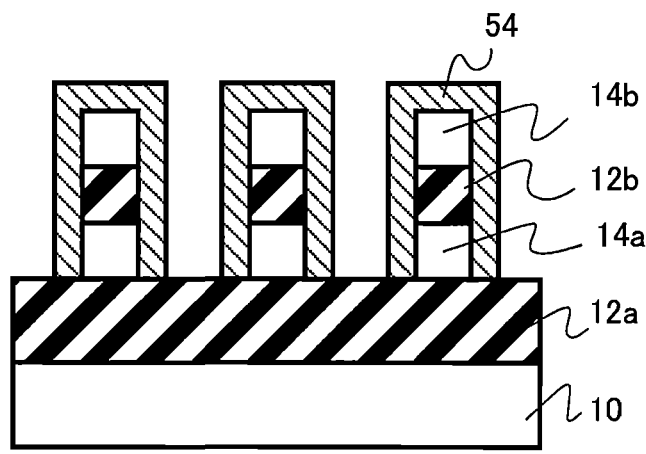
FIG. 19 is a sectional schematic view of the semiconductor device of the fourth embodiment.

FIG. 16 is a top schematic view of the semiconductor device manufactured by the semiconductor device manufacturing method of the present embodiment. FIG. 17 is a sectional schematic view of a plane E-E (gate length direction) in FIG. 16. FIG. 18 is a sectional schematic view of a plane F-F (gate width direction) in FIG. 16. FIG. 19 is a sectional schematic view of a plane G-G (gate width direction) in FIG. 16.

This polycrystalline silicon nanowire transistor includes: a silicon substrate 10; a first oxide film 12a formed on this silicon substrate 10; a first polycrystalline silicon layer 18a, formed on this first oxide layer 12a and having one or more narrow portions (silicon nanowires) 14a and wide portions 16a; a second oxide film 12b, formed on the polycrystalline silicon layer 18a and having one or more narrow portions; a second polycrystalline silicon layer 18b, formed on this second oxide film 12b and having one or more narrow portions (silicon nanowires) 14b and wide portions 16b; a gate insulating film 20 formed on the side faces of the nanowire of the first polycrystalline silicon layer 18a and the side faces and the top face of the nanowire of the second polycrystalline silicon layer 18b; a gate electrode 22 formed on this gate insulating film 20; gate side walls 24 formed on both sides of this gate electrode 22; an epitaxial silicon layer 54 formed on regions outside the gate side walls 24 of the first polycrystalline silicon layer 18a and the second polycrystalline silicon layer 18b; and a source region 28 and a drain region 30 which are formed in the silicon nanowire and the epitaxial silicon layer 54 so as to sandwich channel regions 26a and 26b. It should be noted that the gate insulating film 20 may extend to and lies on the side faces of the second oxide film 12b.

In the silicon nanowires 14a and 14b, regions, on top of which the gate electrode 22 is formed, function as the channel regions 26a and 26b. The channel regions 26a and 26b each have a plate-like structure (nanowire structure), for example with a width (length in the gate width direction) of the order of 3 to 25 nm and a height of the order of 3 to 40 nm.

The nanowire 14a which is the narrow portion of the first polycrystalline silicon layer 18a and the nanowire 14b which is the narrow portion of the second polycrystalline silicon layer 18b have tensile strain in the gate length direction (E-E direction).

Hereinafter, a semiconductor device manufacturing method of the present embodiment is described with reference to the drawings. FIGS. 20 to 24 are sectional schematic views showing the manufacturing method of the present embodiment. FIGS. 20 and 22 to 24 are sectional schematic views corresponding to the plane F-F in FIG. 16. FIG. 21 is a top schematic view.

Figure 20:
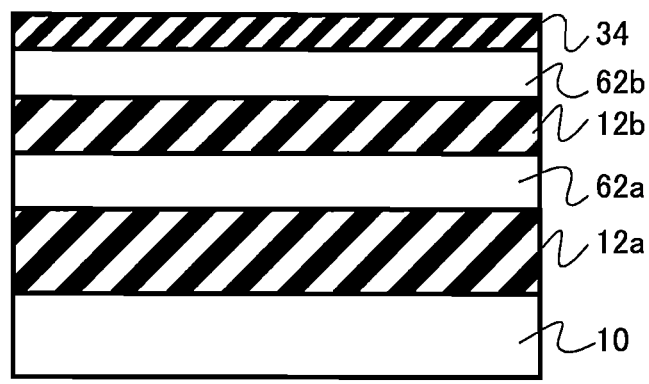
FIG. 20 is a sectional schematic view showing a semiconductor device manufacturing method of the fourth embodiment.
Figure 21:
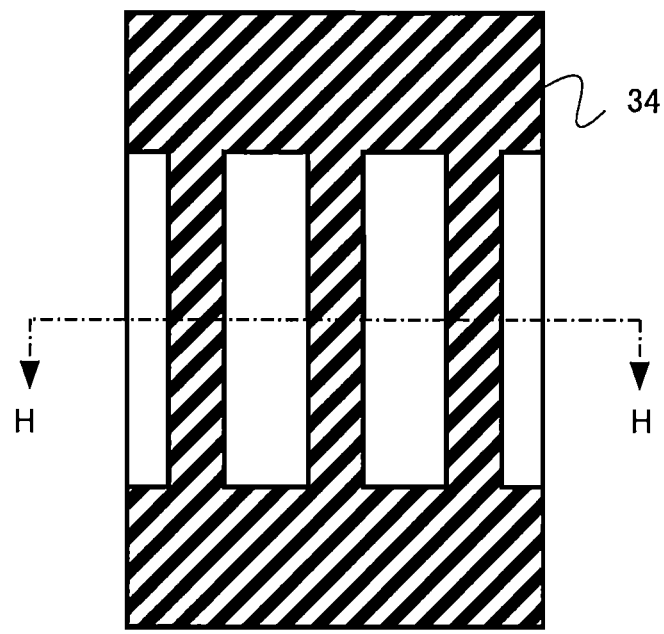
FIG. 21 is a top schematic view showing the semiconductor device manufacturing method of the fourth embodiment.

First, as shown in FIG. 20, a structure made up of the first oxide film (first insulating layer) 12a, a first amorphous silicon layer 62a, the second oxide film (second insulating layer) 12b, a second amorphous silicon layer 62b and the hard mask layer 34 is formed on the bulk silicon substrate 10. The first amorphous silicon layer 62a and the second amorphous silicon layer 62b each have a thickness of the order of 3 to 40 nm. It is to be noted that a polycrystalline silicon layer may be formed in place of the amorphous silicon layer.

Figure 22:
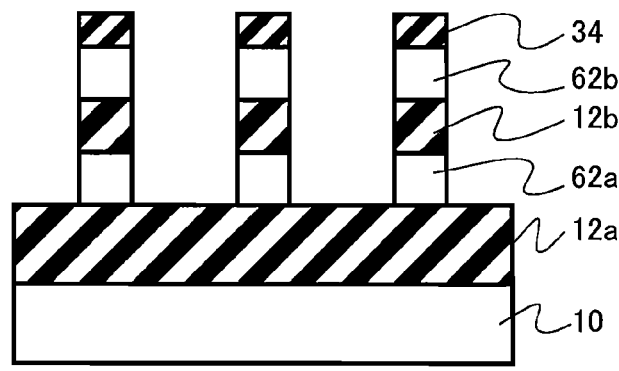
FIG. 22 is a sectional schematic view showing the semiconductor device manufacturing method of the fourth embodiment.

Subsequently, as shown in the top schematic view of FIG. 21 and FIG. 22 as the sectional view of a plane H-H in FIG. 21, after patterning of the hard mask layer 34, the second amorphous silicon layer 62b, the second oxide film 12b and the first amorphous silicon layer 62a are etched with this hard mask layer 34 used as a mask, to partially narrow (form into plate shape) the first amorphous silicon layer 62a and the second amorphous silicon layer 62b in the gate width direction. That is, the amorphous silicon layers 62a and 62b having narrow portions are formed. The amorphous silicon layer formed into plate shape (silicon nanowire) has a width of the order of 3 to 25 nm.

Figure 23:
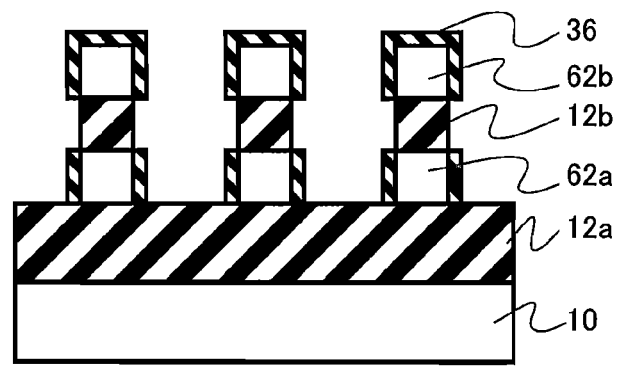
FIG. 23 is a sectional schematic view showing the semiconductor device manufacturing method of the fourth embodiment.

Subsequently, as shown in the sectional schematic view in the gate width direction of FIG. 23, after removal of the hard mask layer 34, the protective insulating film 36 is formed on the side faces of the nanowire of the first amorphous silicon layer 62a and the side faces and the top face of the amorphous silicon nanowires of the second amorphous silicon layer 62b. The protective insulating film 36 is, for example, a silicon oxide film. As a method for forming the protective insulating film 36, thermal oxidation, CVD or the like can be applied. The protective insulating film has a thickness of the order of 1 to 10 nm. It is to be noted that in FIG. 23, the protective insulating film 36 is formed by thermal oxidation. In the case of using CVD, the protective insulating film 36 may extends to and lies on the side faces of the second oxide film 12b and the top face of the first oxide film 12a.

Figure 24:
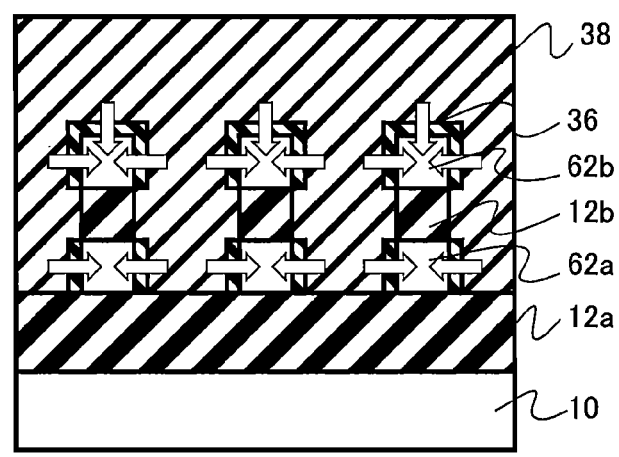
FIG. 24 is a sectional schematic view showing the semiconductor device manufacturing method of the fourth embodiment.

Subsequently, as shown in the sectional schematic view in the gate width direction of FIG. 24, the strain inducing insulating film (third insulating layer) 38, having a larger thermal expansion coefficient than that of silicon, is formed on the protective insulating film 36. The silicon nitride film has a thickness of the order of 10 to 100 nm. Herein, the strain inducing insulating film 38 is not restricted to the silicon nitride film, but another material with a larger thermal expansion coefficient than that of silicon may be used. At this time, as shown in FIG. 24, it is desirable to form the strain inducing insulating film 38 so as to fill a space between the narrow portions.

Subsequently, thermal treatment is performed to crystallize the first amorphous silicon layer 62a and the second amorphous silicon layer 62b. In the case of forming the polycrystalline silicon layer in place of the amorphous silicon layer at the step of FIG. 20, the crystal grain size increases due to this thermal treatment.

As thermal treatment conditions ma be a temperature of 500 to 1100° C., a nitrogen atmosphere, and the time of several ms to several tens of hours. At the time of this thermal treatment, the silicon nitride films surrounding the amorphous silicon layers 62a and 62b expand due to heat, and the amorphous silicon layers 62a and 62b on the inside are thus applied with pressing force within the cross section in the width direction of the nanowires, as shown in white arrows of FIG. 24.

As a consequence, tensile strain is induced in the length direction in the amorphous silicon nanowire. Since the crystallization occurs with this tensile strain in the induced state, the tensile strain naturally remains in the nanowire length direction in each crystal grain after the crystallization.

Subsequently, the strain inducing insulating film 38 as the silicon nitride film is removed. For this removal treatment, a process may be used which is capable of selectively removing the silicon nitride film with respect to the protective insulating film 36 underneath, and for example, wet etching by phosphoric acid, reactive ion etching, or the like can be applied. It should be noted that, even after removal of the silicon nitride film, the tensile strain induced at the time of crystallization of the polycrystalline silicon nanowire remains in the crystal grains.

Subsequent removal of the protective insulating film 36 and formation of the gate insulating film 20, the gate electrode 22 and the gate side walls 24 are similar to those in the first embodiment.

After formation of the gate side walls 24, a silicon layer with a thickness of several tens of nm is epitaxially grown in the region outside the gate side walls 24 of the first polycrystalline silicon layer 18a and the second polycrystalline silicon layer 18b, and the first polycrystalline silicon layer 18a is connected with the second polycrystalline silicon layer 18b by the silicon layer. Accordingly, all of a plurality of source regions 28 and all of a plurality of drain regions 30, which are formed in the first polycrystalline silicon layer 18a and the second polycrystalline silicon layer 18b are made electrically common. That is, the source regions are electrically conducted with one another, and the drain regions are electrically conducted with one another.

It is to be noted that, if impurity doped silicon layer is epitaxially grown here, it is possible to omit the following ion implantation step, to form the source-drain region. Further, it is also possible to connect the first polycrystalline silicon layer 18a with the second polycrystalline silicon layer 18b in the wiring step, without bringing about the epitaxial growth.

Then, ion implantation is performed, to form the source region 28 and the drain region 30 in the regions outside the gate side walls of the first polycrystalline silicon layer 18a and the second polycrystalline silicon layer 18b, and the epitaxial silicon layer 54.

Afterward, the conventional transistor manufacturing process is performed to complete the polycrystalline silicon nanowire transistor.

It should be noted that, although the two polycrystalline silicon layers were assumed in the foregoing description, a structure with increased polycrystalline silicon layers, e.g. three layers or four layers, can be manufactured in a similar manufacturing method.

According to the present manufacturing method, as in the nanowire transistor manufactured by the manufacturing method of the first embodiment, tensile strain in the gate length direction is induced in the channel of the polycrystalline silicon nanowire, so that the mobility and the on-current of the n-type transistor can be significantly improved.

Further, according to the present manufacturing method, as in the nanowire transistor manufactured by the manufacturing method of the first embodiment, crystal grain expansion occurs in the polycrystalline silicon nanowire channel, and the S-factors of the n-type nanowire transistor and the p-type nanowire transistor thus decrease, so that the off-current can be decreased and variations in characteristics among the devices can be suppressed.

Moreover, according to the present manufacturing method, since the plurality of polycrystalline silicon layers are stacked in the height direction, it is possible to increase an amount of a drain current of the nanowire transistor without increasing an occupied area of the substrate.

With the use of the bulk substrate in the present embodiment, the manufacturing cost can be significantly reduced as compared with a monocrystalline silicon nanowire transistor manufactured using the SOI substrate.

It is to be noted that the case was described in the present embodiment where all of the plurality of source regions and all of the plurality of drain regions formed in the first and second semiconductor layers are made electrically common. However, for example, it is possible to make at least two out of the plurality of source regions formed in the first and second semiconductor layers, or at least two out of the plurality of drain regions electrically independent, so as to make all or part of the transistors in each layer operate as different transistors. It is thereby possible to construct a high-density circuit through effective use of the stacked transistors.

Fifth Embodiment

The semiconductor device manufacturing method of the present embodiment further has, in the manufacturing method of the fourth embodiment, the steps of: forming a charge-storage insulating film for storing an electric charge on the gate insulating film between the step of forming the gate insulating film and the step of forming the gate electrode; and forming a block insulating film for blocking an electric charge on the charge-storage insulating film.

A semiconductor device manufacturing method of the present embodiment is the same as that of the fourth embodiment except that the stacked polycrystalline silicon nanowire transistors constitute memory cells of a NAND nonvolatile memory. Therefore, a description of contents overlapped with those of the fourth embodiment is not repeated here.

Figure 25:
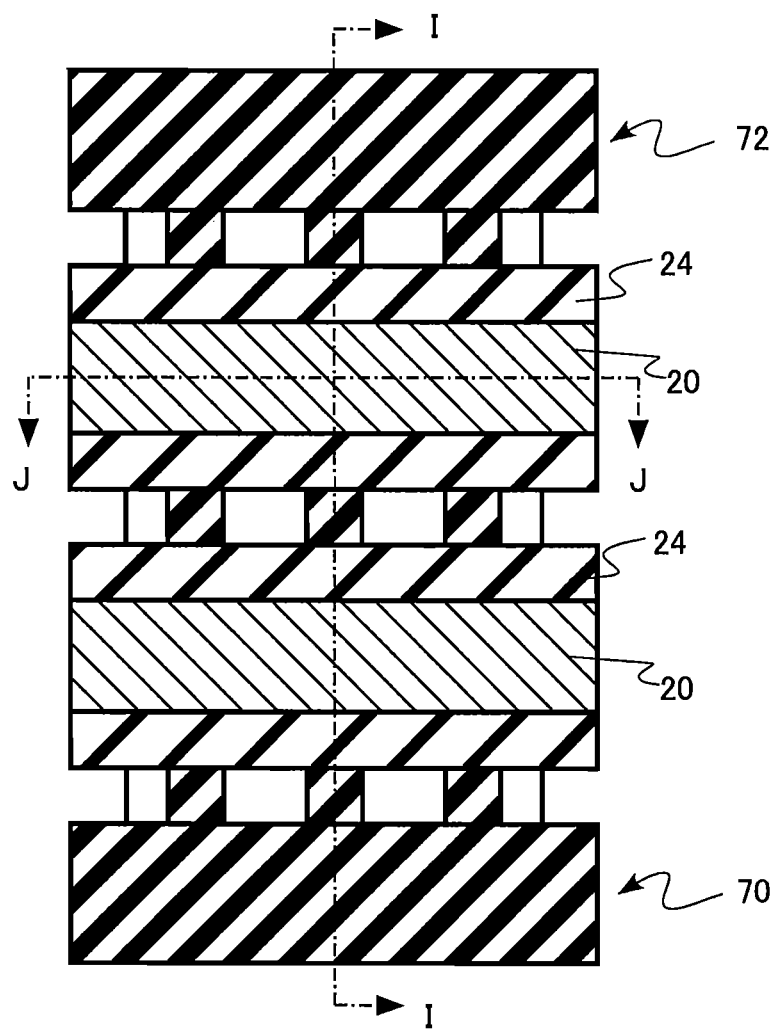
FIG. 25 is a top schematic view of a semiconductor device of a fifth embodiment.
Figure 26:
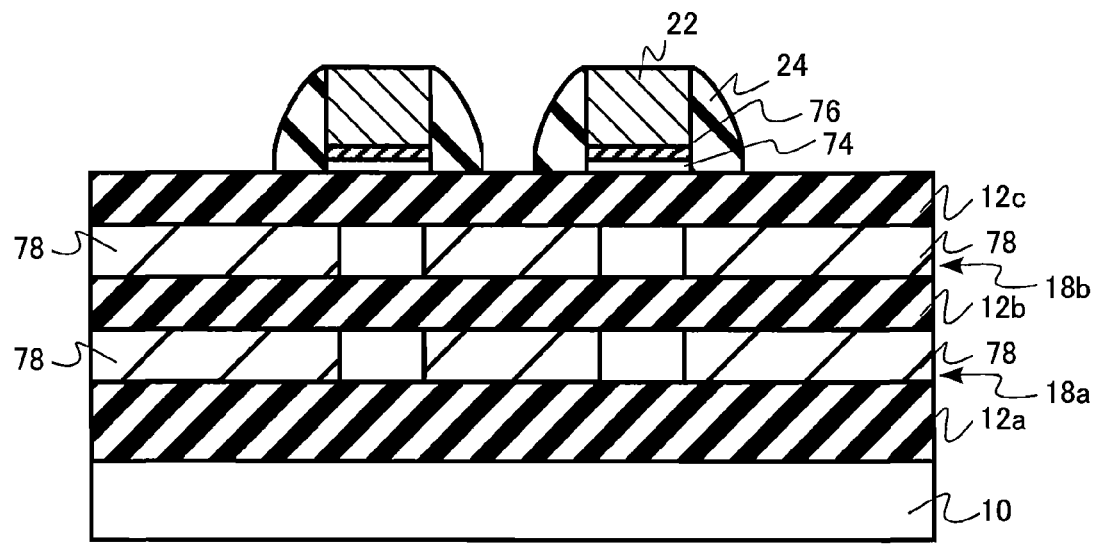
FIG. 26 is a sectional schematic view of the semiconductor device of the fifth embodiment.
Figure 27:
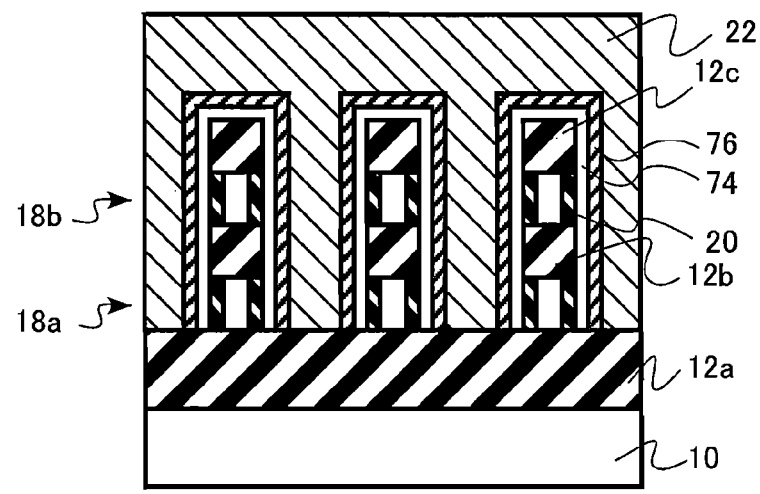
FIG. 27 is a sectional schematic view of the semiconductor device of the fifth embodiment.

FIG. 25 is a top schematic view of the semiconductor device manufactured by the semiconductor device manufacturing method of the present embodiment. FIG. 26 is a sectional schematic view of a plane I-I (gate length direction) in FIG. 25. FIG. 27 is a sectional schematic view of a plane J-J (gate width direction) in FIG. 25.

It should be noted that in FIGS. 25 to 27, only part of the memory cell array of the NAND nonvolatile memory is illustrated for the sake of simplicity of the description. For example, a description of a constituent for constituting the NAND nonvolatile memory, such as a select gate transistor, is omitted.

In this memory cell array of the NAND nonvolatile memory, a memory cell made up of the polycrystalline silicon nanowire transistor is arranged between a common source region 70 and a common bit line region 72.

This nonvolatile memory includes: a silicon substrate 10; a first oxide film 12a formed on this silicon substrate; a first polycrystalline silicon layer 18a, formed on this first oxide layer 12a and having one or more narrow portions (silicon nanowires) 14a and wide portions 16a; a second oxide film 12b, formed on the polycrystalline silicon layer 18a and having one or more narrow portions; a second polycrystalline silicon layer 18b, formed on this second oxide film 12b and having one or more narrow portions (silicon nanowires) 14b; a third oxide film 12c, formed on this second polycrystalline silicon layer 18b and having one or more narrow portions; a gate insulating film 20, which is formed on the side faces of the nanowire of the first polycrystalline silicon layer 18a and the side faces of the nanowire of the second polycrystalline silicon layer 18b and functions as a tunnel insulating film; a charge-storage insulating film 74 for storing an electric charge, which is formed on this gate insulating film 20; a block insulating film 76 for blocking an electric charge, which is formed on the charge-storage insulating film 74; the gate electrode 22 which is formed on the block insulating film 76 and functions as a control gate; the gate side walls 24 formed on both sides of this gate electrode 22; and a source-drain region 78 formed outside the gate side walls 24 of the first polycrystalline silicon layer 18a and the second polycrystalline silicon layer 18b. It should be noted that in FIG. 27, the gate insulating film 20 is formed only on the side faces of the nanowire of the first polycrystalline silicon layer 18a and the side faces of the nanowire of the second polycrystalline silicon layer 18b, and this represents a characteristic at the time of the formation by oxidation method. The gate insulating film 20 may extend to and lie on the side faces of the second oxide film 12b and the side faces and the top face of the third oxide film 12c.

In FIGS. 25 to 27, two layers of the polycrystalline silicon nanowire transistors as the memory cells are stacked. In each layer, three NAND strings made up of two polycrystalline silicon nanowire transistors connected in series are illustrated.

As the gate insulating film (tunnel insulating film) 20 and the block insulating film 76, for example, a silicon oxide film, a silicon oxynitride film, a silicon nitride film or a high-dielectric insulating film such as a hafnium oxide film, can be used. Further, as the charge-storage insulating film 74, for example, the high-dielectric insulating film, such as the silicon nitride film or the hafnium oxide film, can be used.

A regions the side faces of which are formed with the gate electrodes 22 in each of the first and second polycrystalline silicon layers 18a and 18b operates as the channel region. The channel region has a plate-like structure (nanowire structure), for example with a width (length in the gate width direction) of the order of 3 to 25 nm and a height of the order of 3 to 40 nm.

When a high voltage is applied to the gate electrode 22, electron capture occurs from the channel region on the charge-storage insulating film 74, to cause a shift of a threshold voltage of the transistor, and even when a voltage of the gate electrode is set to zero, the electron trapped state is held. Therefore, the polycrystalline silicon nanowire transistor of the present embodiment functions as a nonvolatile memory.

Figure 28:
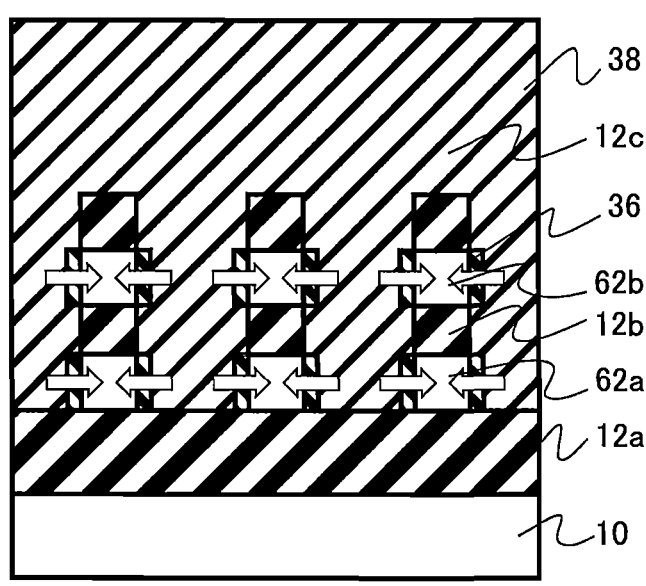
FIG. 28 is a sectional schematic view showing a semiconductor device manufacturing method of the fifth embodiment.

FIG. 28 is a sectional schematic view in the gate width direction, showing a semiconductor device manufacturing method of the present embodiment.

In the manufacturing method of the present embodiment, first, a structure made up of the first oxide film 12a, the first amorphous silicon layer 62a, the second oxide film 12b, the second amorphous silicon layer 62b and the third oxide film 12c also serving as a hard mask layer is formed on the bulk silicon substrate 10. The first amorphous silicon layer 62a and the second amorphous silicon layer 62b each have a thickness of the order of 3 to 40 nm. It is to be noted that a polycrystalline silicon layer may be formed in place of the amorphous silicon layer.

Subsequently, after patterning of the third oxide film 12c, the second amorphous silicon layer 62b, the second oxide film 12b and the first amorphous silicon layer 62a are etched with the third oxide film 12c used as a hard mask, to partially narrow (form into plate-like shape) the first amorphous silicon layer 62a and the second amorphous silicon layer 62b in the gate width direction. That is, the amorphous silicon layers 62a and 62b having narrow portions are formed. The amorphous silicon layer formed into plate shape (silicon nanowire) has a width of the order of 3 to 25 nm.

Subsequently, as shown in the sectional schematic view in the gate width direction of FIG. 28, the protective insulating film 36 is formed on the side faces of the nanowire of the first amorphous silicon layer 62a and the side faces and the top face of the silicon nanowires of the second amorphous silicon layer 62b. The protective insulating film 36 is, for example, a silicon oxide film. As a method for forming the protective insulating film 36, thermal oxidation, CVD or the like can be applied. The protective insulating film has a thickness of the order of 1 to 10 nm.

Then, in a similar manner to the fourth embodiment, the strain inducing insulating film 38, having a larger thermal expansion coefficient than that of silicon, is formed on the protective insulating film 36. The silicon nitride film has a thickness of the order of 10 to 100 nm. Herein, the strain inducing insulating film 38 is not restricted to the silicon nitride film, but another material with a larger thermal expansion coefficient than that of silicon may be used.

Subsequently, the protective insulating film 36 is removed, and the gate insulating film 20 that functions as a tunnel insulating film, the charge-storage insulating film 74, the block insulating film 76 and the gate electrode 22 are sequentially formed. Thereafter, the gate side wall 24 is formed, and the source-drain region is formed by ion implantation.

Afterward, the conventional transistor manufacturing process is performed to complete the memory cell transistor of the NAND nonvolatile memory.

According to the present manufacturing method, as in the nanowire transistor manufactured by the manufacturing method of the first embodiment, tensile strain in the gate length direction is induced in the polycrystalline silicon layer, so that the mobility and the on-current of the n-type memory cell transistor can be significantly improved. As for the memory operation, it is possible to increase a sensing current at the time of reading, so as to realize speed-up of reading operation.

Further, according to the present manufacturing method, as in the nanowire transistor manufactured by the manufacturing method of the first embodiment, crystal grain growth occurs in the polycrystalline silicon layer, and the S-factors of the n-type memory transistor and the p-type memory transistor thus decrease, so that the off-current can be decreased and variations in characteristics among the devices can be suppressed.

Further, according to the present manufacturing method, by stacking the memory cell transistors to increase the number of memory cell transistor layers, it is possible to produce a large number of memory cell transistors within the same substrate area, so as to realize increased density and reduced manufacturing cost.

Sixth Embodiment

A semiconductor device manufacturing method of the present embodiment has the steps of: forming a first insulating layer on a semiconductor substrate; forming a gate electrode layer on the first insulating layer; forming a second insulating layer on the gate electrode layer; forming a groove penetrating through the second insulating layer, the gate electrode layer and the first insulating layer; forming a gate insulating film on the inner side face of the groove; forming an amorphous or polycrystalline semiconductor layer on the inner side face of the gate insulating film; forming in the inner side wall of the semiconductor layers a third insulating layer having a thermal expansion coefficient larger than that of the semiconductor layers; performing thermal treatment on the semiconductor layer; and removing the third insulating layer.

The semiconductor device manufacturing method of the present embodiment is to apply strain to a cylindrical amorphous silicon layer, so as to form a vertical cylindrical polycrystalline transistor with high performance.

Figure 29A:
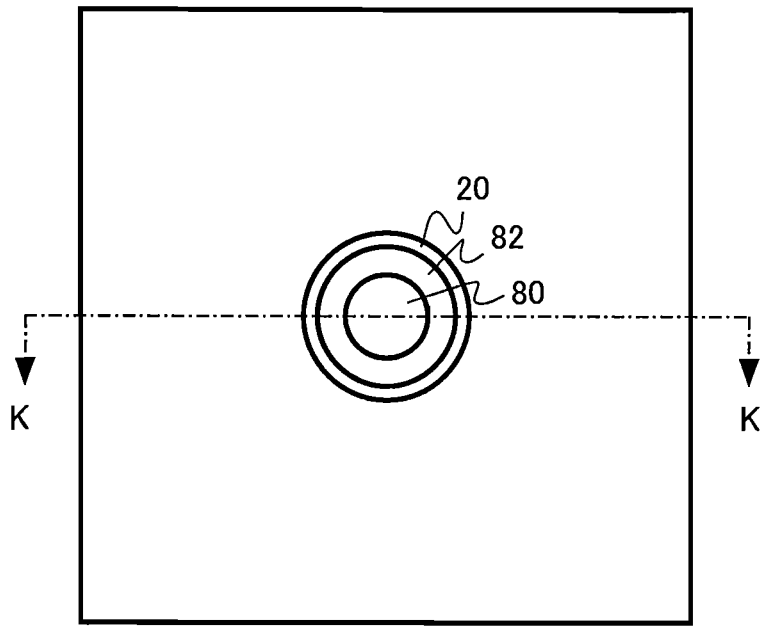
FIGS. 29A and 29B are sectional schematic views of a semiconductor device of a sixth embodiment
Figure 29B:
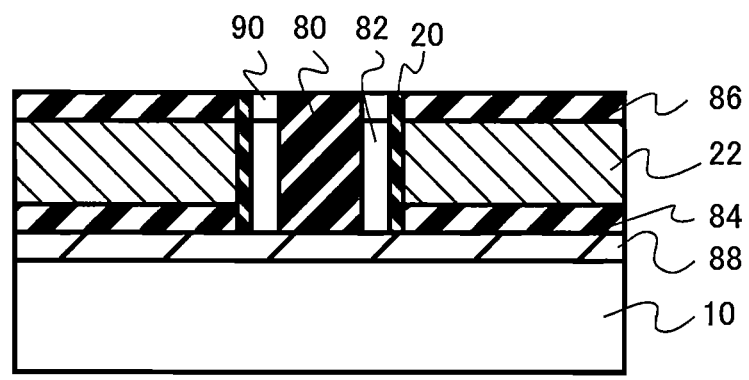

FIGS. 29A and 29B are schematic views of the semiconductor device manufactured by the semiconductor device manufacturing method of the present embodiment. FIG. 29A is a top schematic view, and FIG. 29B is a sectional schematic view of a plane K-K in FIG. 29A.

This vertical cylindrical polycrystalline transistor includes: a silicon substrate 10; a columnar inner oxide film 80 formed on this silicon substrate 10; a cylindrical polycrystalline silicon layer 82 formed so as to surround this inner oxide film 80; the gate insulating film 20 formed so as to surround this cylindrical polycrystalline silicon layer 82; the gate electrode layer 22 formed so as to surround this gate insulating film 20; a first oxide film 84 as a layer under the gate electrode layer 22; a second oxide film 86 as a layer on the gate electrode layer 22; a source region 88 formed on the top of the silicon substrate 10; and a drain region 90 formed on the top of the cylindrical polycrystalline silicon layer 82.

A region of the cylindrical polycrystalline silicon layer 82 around which the gate electrode 22 is formed, operates as the channel region. The columnar inner oxide film 80 has a diameter of the order of 10 to 100 nm, and the cylindrical polycrystalline silicon layer 82 has a thickness of the order of 3 to 25 nm. The cylindrical polycrystalline silicon layer 82 has tensile strain in the gate length direction, in other words, a vertical direction to the surface plain of the silicon substrate 10.

Figure 30:
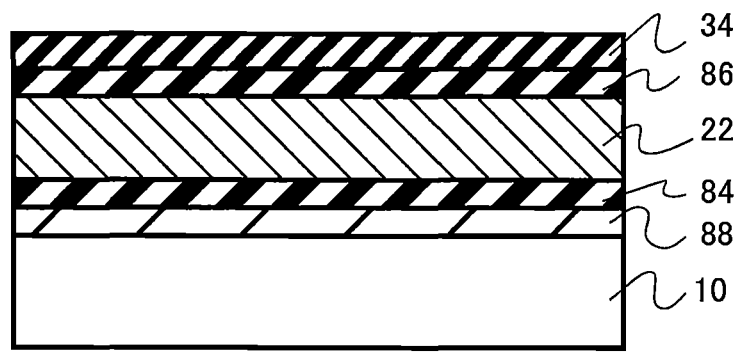
FIG. 30 is a sectional schematic view showing a semiconductor device manufacturing method of the sixth embodiment.
Figure 31:
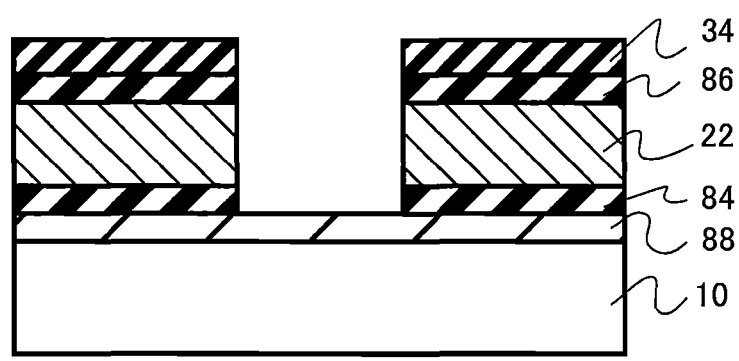
FIG. 31 is a sectional schematic view showing the semiconductor device manufacturing method of the sixth embodiment.
Figure 32:
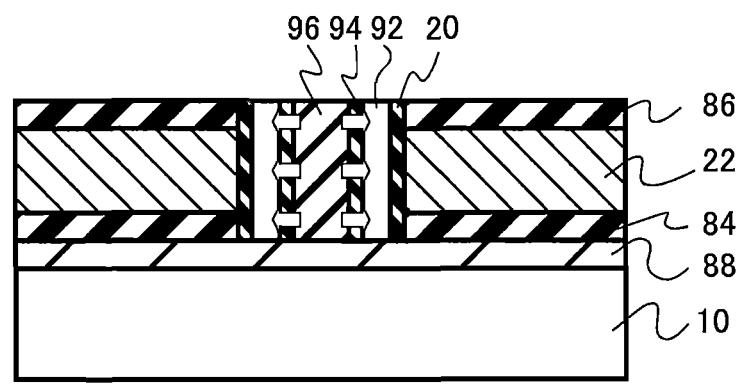
FIG. 32 is a sectional schematic view showing the semiconductor device manufacturing method of the sixth embodiment.

Hereinafter, a manufacturing method of the present embodiment is described with reference to the drawings. FIGS. 30 to 32 are sectional schematic views showing the manufacturing method of the present embodiment.

First, as shown in FIG. 30, ion implantation is performed onto the bulk silicon substrate 10, to form the source region 88. Thereafter, a structure is formed which is made up of the first oxide film 84, the gate electrode layer 22, the second oxide film 86 and the hard mask layer 34. Herein, as the gate electrode 22, poly Si, metal silicide, TiN, W, TaC or the like may be applied.

Subsequently, as shown in FIG. 31, after patterning of the hard mask layer 34, the second oxide film 86, the gate electrode layer 22 and the first oxide film 84 are etched with this hard mask layer 34 used as a mask, to forma circular groove that reaches the silicon substrate 10.

Then, as shown in FIG. 32, after removal of the hard mask layer 34, the gate insulating film 20, the cylindrical amorphous silicon layer 92, a protective insulating film 94, and a strain inducing insulating film (third insulating layer) 96 which is the silicon nitride film are formed inside the groove. At this time, as shown in FIG. 32, the inside of the groove is desirably filled with the strain inducing insulating film 96. As the gate insulating film 20, the silicon oxide film, the silicon oxynitride film, the silicon nitride film or the high-dielectric insulating film such as the hafnium oxide film, can be used.

The cylindrical amorphous silicon layer 92 has a thickness of the order of 3 to 20 nm. It is to be noted that a polycrystalline silicon layer may be formed in place of the amorphous silicon layer. Herein, the strain inducing insulating film 96 is not restricted to the silicon nitride film, but another material with a larger thermal expansion coefficient than that of silicon may be used.

Subsequently, thermal treatment is performed to crystallize the cylindrical amorphous silicon layer 92. In the case of forming the polycrystalline silicon in place of the amorphous silicon layer at the step of FIG. 30, the crystal grain size increases due to this thermal treatment. Thermal treatment conditions may be a temperature of 500 to 1100° C., a nitrogen atmosphere, and the time of several ms to several tens of hours. At the time of this thermal treatment, the strain inducing insulating film 96 which is the silicon nitride film surrounding the inside of the cylindrical amorphous silicon layer 92 expands due to heat, and the amorphous silicon layer 92 is thus applied with pressing force within a plane in parallel with the substrate as shown in white arrows of FIG. 32.

As a consequence, tensile strain is induced in the vertical direction of the substrate in the amorphous silicon layer. Since the crystallization occurs with this tensile strain in the induced state, the tensile strain naturally remains in the vertical direction to the silicon substrate 10 in each crystal grain after the crystallization.

Subsequently, the strain inducing insulating film 96 which is the silicon nitride film is removed. For this removal treatment, a process may be used which is capable of selectively removing the silicon nitride film with respect to the protective insulating film 94 underneath, and for example, wet etching by phosphoric acid, reactive ion etching, or the like can be applied. It should be noted that, even after removal of the silicon nitride film, the tensile strain induced at the time of crystallization of the cylindrical polycrystalline silicon layer remains in the crystal grains.

Subsequently, the protective insulating film 94 is removed, to expose the inner side face of the cylindrical polycrystalline silicon layer 82. For this removal treatment, for example, wet etching by phosphoric acid is used.

Then, the inner oxide film 80 is formed so as to fill the inside of the groove. Subsequently, ion implantation is performed to form the drain region 90 on the top of the cylindrical polycrystalline silicon layer 82.

Afterward, the conventional transistor manufacturing process is performed to complete the cylindrical polycrystalline transistor.

According to the present manufacturing method, as in the nanowire transistor manufactured by the manufacturing method of the first embodiment, tensile strain in the gate length direction is induced in the cylindrical polycrystalline silicon layer, so that the mobility and the on-current of the n-type cylindrical polycrystalline transistor can be significantly improved.

According to the present manufacturing method, as in the nanowire transistor manufactured by the manufacturing method of the first embodiment, crystal grain growth occurs in channel of the cylindrical polycrystalline silicon layer, and the S-factors of the n-type cylindrical polycrystalline transistor and the p-type cylindrical polycrystalline transistor thus decrease, so that the off-current can be decreased and variations in characteristics among the devices can be suppressed.

According to the present manufacturing method, without use of lithography in patterning of the gate electrode, it is possible to form a fine gate pattern beyond a resolution limit of lithography.

According to the present manufacturing method, since a substrate area occupied by one transistor can be reduced as compared with a conventional flat transistor, it is possible to produce more devices within the same substrate area, so as to realize manufacturing cost reduction.

Seventh Embodiment

The semiconductor device manufacturing method of the present embodiment further has, in the manufacturing method of the sixth embodiment, the steps of: forming a block insulating film on the inner side face of the groove between the step of forming the groove and the step of forming the gate insulating film; and forming a charge-storage insulating film for storing an electric charge on the inner side face of the block insulating film.

The semiconductor device manufacturing method of the present embodiment is to provide an insulating film for charge storage in a cylindrical polycrystalline transistor, to realize a memory cell of a vertical NAND nonvolatile memory. Hereinafter, this nonvolatile memory is also referred to as a cylindrical polycrystalline memory.

Figure 33A:
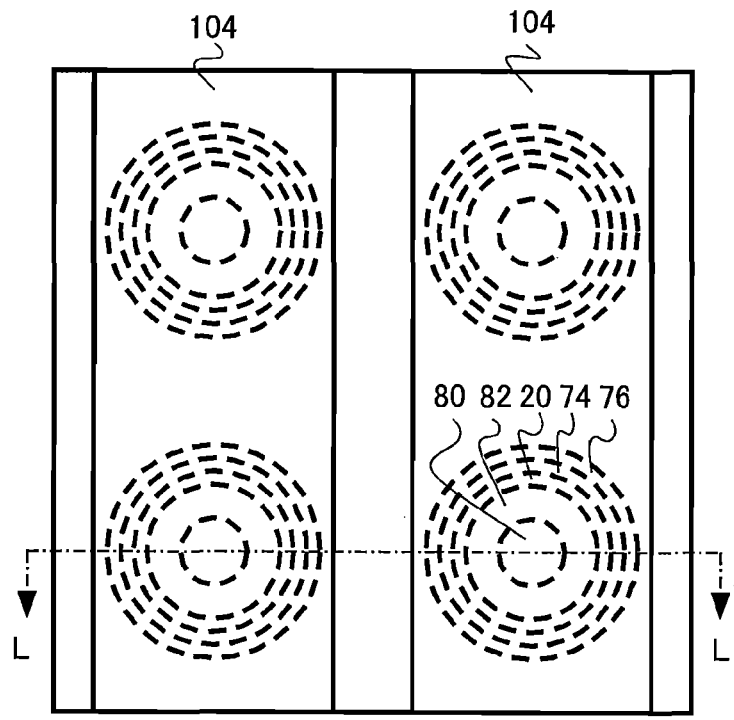
FIGS. 33A and 33B are sectional schematic views of a semiconductor device of a seventh embodiment.
Figure 33B:
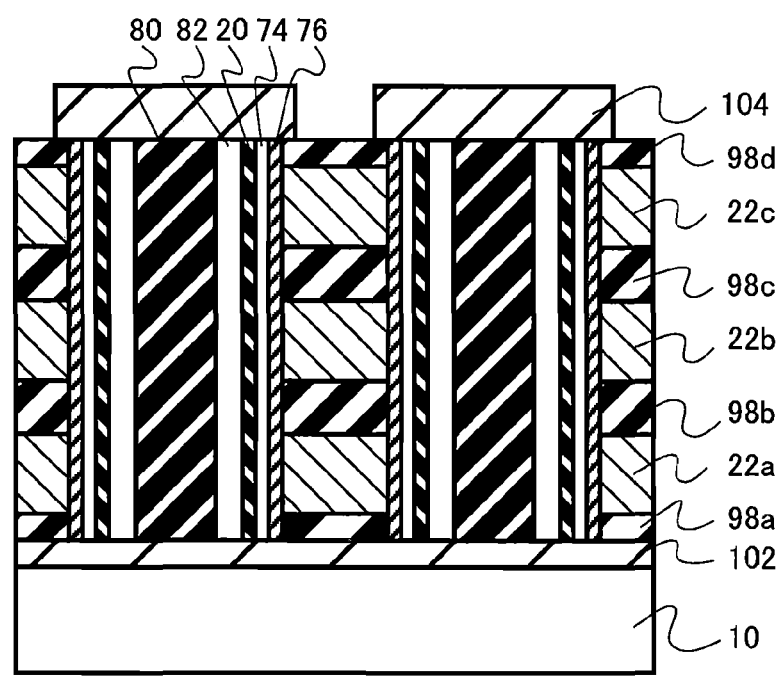

FIGS. 33A and 33B are schematic views of the semiconductor device manufactured by the semiconductor device manufacturing method of the present embodiment. FIG. 33A is a top schematic view, and FIG. 33B is a sectional schematic view of a plane L-L in FIG. 33A.

It should be noted that in FIGS. 33A and 33B, only part of the memory cell array of the NAND nonvolatile memory is illustrated for the sake of simplicity of the description. For example, a description of a element for constituting the NAND nonvolatile memory, such as a selection gate transistor, is omitted.

In the memory cell array of the NAND nonvolatile memory, a memory cell made up of the cylindrical polycrystalline silicon transistor is arranged between a common source 102 and a common bit line 104.

This vertical cylindrical polycrystalline memory includes: a silicon substrate 10; the columnar inner oxide film 80 formed on this silicon substrate; the cylindrical polycrystalline silicon layer 82 formed so as to surround this inner oxide film 80; the tunnel insulating film (gate insulating film) 20 formed so as to surround this cylindrical polycrystalline silicon layer 82; the charge-storage insulating film 74 as the silicon nitride film formed on this tunnel insulating film 20; the block insulating film 76 formed on this charge-storage insulating film 74; gate electrode layers 22a to 22c formed so as to surround this block insulating film 76; interlayer insulating films 98a to 98d vertically sandwiching the gate electrode layers; the common source region 102 formed on the top of the silicon substrate 10; and the common bit line 104 formed on the top of the cylindrical polycrystalline silicon layer 82.

Regions of the cylindrical polycrystalline silicon layer 82 around which the gate electrode layers 22a to 22c are formed, operate as the channel regions. When a high voltage is applied to the gate electrode layers 22a to 22c, electron capture occurs from the channel region of the cylindrical polycrystalline silicon layer 82 on the charge-storage insulating film 74 to cause a shift of a threshold voltage of the transistor, and even when voltages of the gate electrode layers 22a to 22c are set to zero, the electron capture state is held, so that the device operates as a nonvolatile memory.

The columnar inner oxide film 80 has a diameter of the order of 10 to 100 nm, and the cylindrical polycrystalline silicon layer 82 has a thickness of the order of 3 to 25 nm. The cylindrical polycrystalline silicon layer 82 has tensile strain in the gate length direction, in other words, a vertical direction to a surface plain of the silicon substrate 10.

In FIG. 33, three cylindrical polycrystalline silicon transistors to serve as memory cells are connected vertically in series, to realize a NAND string. A total of four of these NAND strings are illustrated.

Hereinafter, a manufacturing method of the present embodiment is described with reference to the drawings. FIGS. 34 to 37 are sectional schematic views showing the manufacturing method of the present embodiment.

Figure 34:
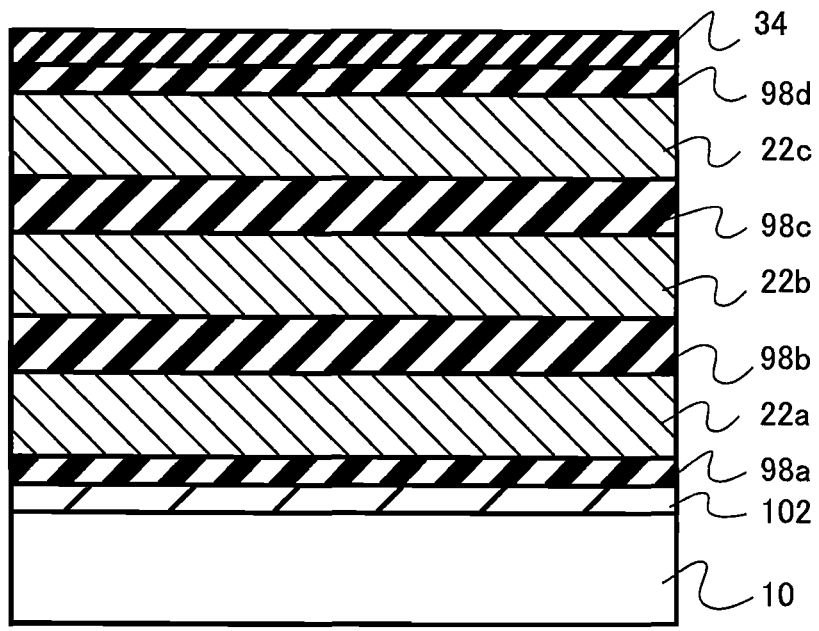
FIG. 34 is a sectional schematic view showing a semiconductor device manufacturing method of the seventh embodiment.

First, as shown in FIG. 34, after ion implantation has been performed onto the bulk silicon substrate 10 to form the common source region 102, a structure is formed which is, for example, made up of the first interlayer insulating film 98a as the silicon oxide film, the first gate electrode layer 22a, the second interlayer insulating film 98b, the second gate electrode layer 22b, the third interlayer insulating film 98c, the third gate electrode layer 22c, the fourth interlayer insulating film 98d, and the hard mask layer 34. Herein, as the gate electrodes 22a to 22c, poly Si, metal silicide, TiN, W, TaC or the like may be applied.

Figure 35:
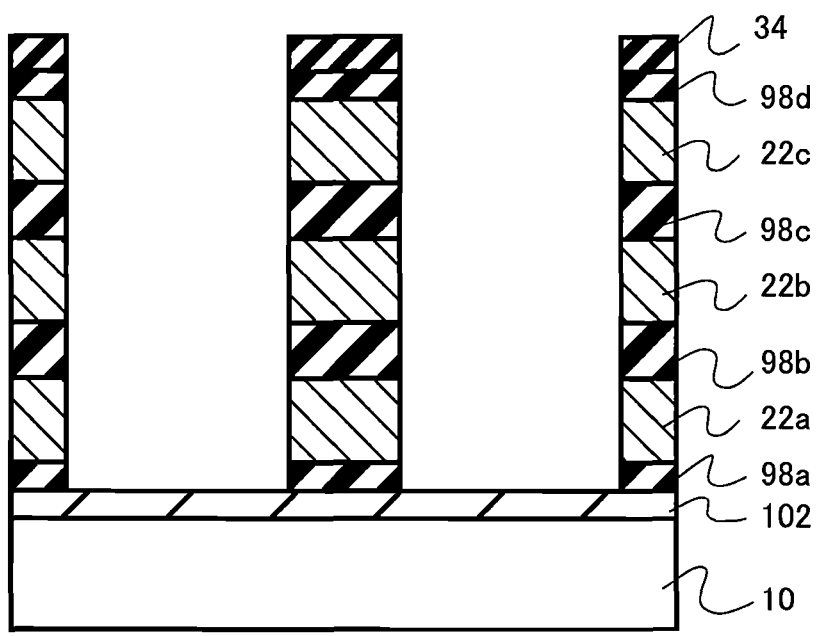
FIG. 35 is a sectional schematic view showing the semiconductor device manufacturing method of the seventh embodiment.

Subsequently, as shown in FIG. 35, after patterning of the hard mask layer 34, the fourth interlayer insulating film 98d, the third gate electrode layer 22c, the third interlayer insulating film 98c, the second gate electrode layer 22b, the second interlayer insulating film 98b, the first gate electrode layer 22a and the first interlayer insulating film 98a are etched with the hard mask layer 34 used as a mask, to form a groove that reaches the silicon substrate 10.

Figure 36:
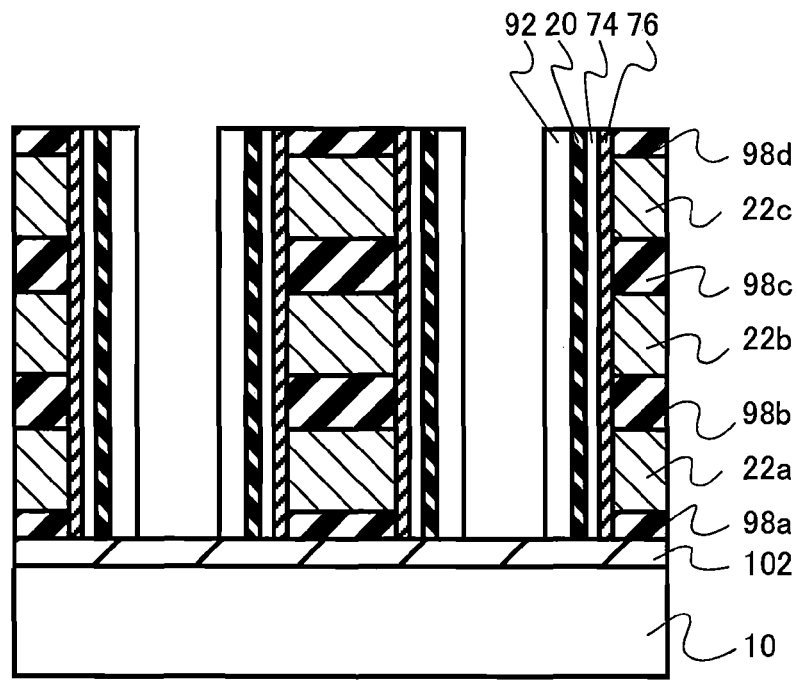
FIG. 36 is a sectional schematic view showing the semiconductor device manufacturing method of the seventh embodiment.
Figure 37:
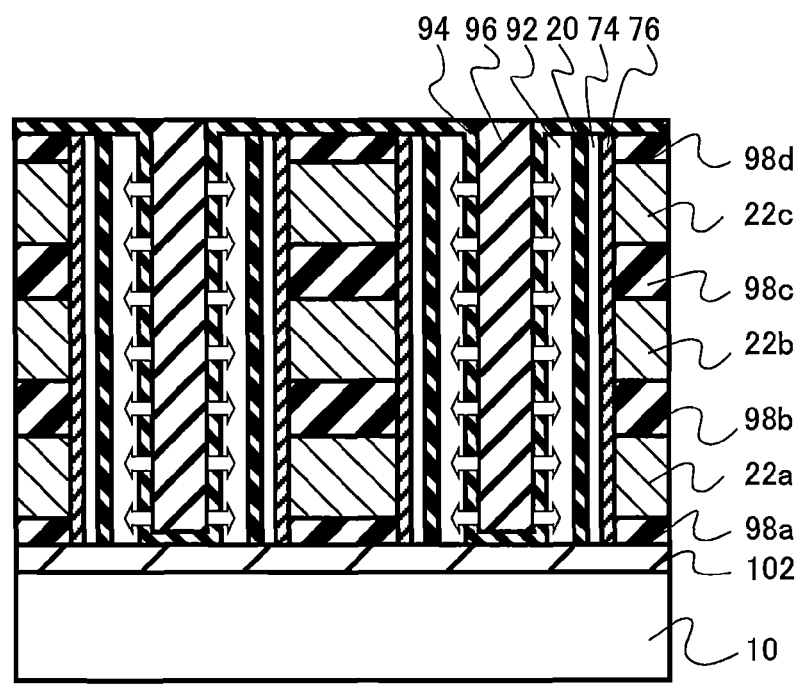
FIG. 37 is a sectional schematic view showing the semiconductor device manufacturing method of the seventh embodiment.

Then, as shown in FIG. 36, after removal of the hard mask layer 34, the block insulating film 76, charge-storage insulating film 74 which is silicon nitride film, the tunnel insulating film (gate insulating film) 20 and the amorphous silicon layer 92 are formed inside the groove. Further, as shown in FIG. 37, the protective insulating film 94 and the strain inducing insulating film 96 which is silicon nitride film, having a larger thermal expansion coefficient than that of silicon, are formed. At this time, the inside of the groove is desirably filled with the strain inducing insulating film 96.

As the block insulating film 76 and the tunnel insulating film (gate insulating film) 20, the silicon oxide film, the silicon oxynitride film, the silicon nitride film or the high-dielectric insulating film such as the hafnium oxide film, can be used. The charge-storage insulating film 74 is not restricted to the silicon nitride film, but the high-dielectric insulating film such as the hafnium oxide film can be used. The cylindrical amorphous silicon layer has a thickness of the order of 3 to 20 nm. It is to be noted that a polycrystalline silicon layer may be formed in place of the amorphous silicon layer. Herein, the strain inducing insulating film is not restricted to the silicon nitride film, but another material with a larger thermal expansion coefficient than that of silicon may be used.

Subsequently, thermal treatment is performed to crystallize the cylindrical amorphous silicon layer 92. In the case of forming the polycrystalline silicon layer in place of the amorphous silicon layer at the stage of FIG. 36, the crystal grain size increases due to this thermal treatment.

Thermal treatment conditions may be a temperature of 500 to 1100° C., a nitrogen atmosphere, and the time of several ms to several tens of hours. At the time of this thermal treatment, the strain inducing insulating film 96 which is silicon nitride film surrounding the inside of the cylindrical amorphous silicon layer 92 expands due to heat, and the amorphous silicon layer is thus applied with pressing force within a plane in parallel with the substrate as shown in white arrows of FIG. 37. As a consequence, tensile strain is induced in the vertical direction of the silicon substrate 10 in the amorphous silicon layer 82. Since the crystallization occurs with this tensile strain in the induced state, the tensile strain naturally remains in the vertical direction to the substrate in each crystal grain after the crystallization.

Subsequently, the silicon nitride film as the strain inducing insulating film 96 is removed. For this removal treatment, a process may be used which is capable of selectively removing the silicon nitride film with respect to the protective oxide film underneath, and for example, wet etching by phosphoric acid, reactive ion etching, or the like can be applied. It should be noted that, even after removal of the silicon nitride film, the tensile strain induced at the time of crystallization of the cylindrical polycrystalline silicon layer remains in the crystal grains.

Subsequently, the protective insulating film 94 is removed to expose the inner side face of the cylindrical polycrystalline silicon layer 82. For this removal treatment, for example, wet etching by phosphoric acid is used. Thereafter, the inner oxide film 80 is formed inside the groove. Then, the metal common bit line 104 is formed.

Afterward, the conventional transistor manufacturing process is performed to complete the cylindrical polycrystalline memory.

It is to be noted that, although the case of three layers of the gate electrode layers, namely the structure of three layers of the device layers arranged with the memory cells, was assumed in the above description, gate electrodes and interlayer insulating films can be further stacked, to make the device layers multi-layered.

According to the present manufacturing method, as in the nanowire transistor manufactured by the manufacturing method of the first embodiment, tensile strain in the gate length direction is induced in the cylindrical polycrystalline silicon layer, so that the mobility and the on-current of the n-type cylindrical polycrystalline memory can be significantly improved. As for the memory operation, it is possible to increase a sensing current at the time of reading, so as to realize speed-up of reading operation.

According to the present manufacturing method, as in the nanowire transistor manufactured by the manufacturing method of the first embodiment, crystal grain growth occurs in the cylindrical polycrystalline silicon layer and the S-factor of the n-type cylindrical polycrystalline memory and the p-type cylindrical polycrystalline memory thus decrease, so that the off-current can be decreased and variations in characteristics among the devices can be suppressed.

According to the present manufacturing method, without use of lithography in treatment on the gate electrode, it is possible to form a fine gate beyond a resolution limit of lithography.

According to the present manufacturing method, since a substrate area occupied by one transistor can be reduced as compared with the conventional flat transistor, it is possible to produce more devices within the same substrate area, so as to realize manufacturing cost reduction.

According to the present manufacturing method, by stacking the gate electrodes/interlayer insulating layers to increase the number of device layers, it is possible to produce a large number of devices within the same substrate area, so as to realize reduction in manufacturing cost of the nonvolatile memory.

According to the present manufacturing method, the strain inducing nitride film is removed after crystallization thermal treatment on the amorphous silicon layer, and the groove is then filled again with the inner oxide film, whereby it is possible to avoid electron capture on the nitride film inside the groove during the operation of the memory, which is problematic in the case of leaving the nitride film inside the groove.

While certain embodiments have been described, these embodiments have been presented by way of example only, and are not intended to limit the scope of the inventions. Indeed, the semiconductor device and the method for manufacturing the semiconductor device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

For example, although the description was made in the embodiments where the case of the amorphous or polycrystalline semiconductor layer being silicon was taken as an example, it is not restricted to silicon, and another semiconductor, such as silicon germanide can also be applied.

What is claimed is:

1. A semiconductor device, comprising:
   a first insulating layer;
   a gate electrode layer provided on the first insulating layer;
   a second insulating layer provided on the gate electrode layer;
   a columnar inner insulating layer extending in a stacking direction of the first insulating layer, the gate electrode layer and the second insulating layer;
   a third insulating layer provided between the gate electrode layer and the columnar inner insulating layer; and
   a polycrystalline semiconductor layer provided between the third insulating layer and the columnar inner insulating layer,
   wherein a crystal lattice spacing of the polycrystalline semiconductor layer in the stacking direction is larger than a crystal lattice spacing in a non-distorted state.

2. The device according to claim 1, further comprising:
   a charge-storage insulating layer provided between the gate electrode layer and the third insulating layer; and
   a fourth insulating layer provided between the gate electrode layer and the charge-storage insulating layer.

3. The device according to claim 1, wherein the polycrystalline semiconductor layer includes silicon.

4. The device according to claim 1, further comprising:
   a source region electrically connected to one end of the polycrystalline semiconductor layer; and
   a drain region electrically connected to other end of the polycrystalline semiconductor layer.

5. The device according to claim 1, wherein the third insulating layer includes at least one of the group consisting of a silicon oxide layer, a silicon oxynitride layer, a silicon nitride layer and a hafnium oxide layer.

6. The device according to claim 2, wherein the charge-storage insulating layer includes at least one of the group consisting of a silicon nitride layer and a hafnium oxide layer.

7. The device according to claim 2, wherein the fourth insulating layer includes at least one of the group consisting of a silicon oxide layer, a silicon oxynitride layer, a silicon nitride layer and a hafnium oxide layer.

8. The device according to claim 1, wherein a tensile strain is induced in the polycrystalline semiconductor layer in the stacking direction.

9. The device according to claim 2, wherein the polycrystalline semiconductor layer includes silicon.

10. The device according to claim 2, wherein a tensile strain is induced in the polycrystalline semiconductor layer in the stacking direction.

11. The device according to claim 2, wherein the polycrystalline semiconductor layer is distorted such that the crystal lattice spacing of the polycrystalline semiconductor layer in the stacking direction is larger than the crystal lattice spacing in the non-distorted state.

* * * * *